United States Patent
Yoon et al.

(10) Patent No.: US 10,930,353 B1
(45) Date of Patent: Feb. 23, 2021

(54) NON-VOLATILE MEMORY DEVICE AND OPERATING METHOD OF THE SAME

(71) Applicant: Samsung Electronics Co., Ltd., Gyeonggi-do (KR)

(72) Inventors: Jungho Yoon, Yongin-si (KR); Seyun Kim, Seoul (KR); Jinhong Kim, Seoul (KR); Soichiro Mizusaki, Suwon-si (KR); Youngjin Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/775,424

(22) Filed: Jan. 29, 2020

(30) Foreign Application Priority Data

Jul. 30, 2019 (KR) .......................... 10-2019-0092660

(51) Int. Cl.
  *G11C 16/10* (2006.01)
  *H01L 27/11582* (2017.01)
  (Continued)

(52) U.S. Cl.
  CPC .............. *G11C 16/10* (2013.01); *G11C 16/24* (2013.01); *H01L 27/11582* (2013.01); *G11C 16/0483* (2013.01); *G11C 16/26* (2013.01)

(58) Field of Classification Search
  CPC ......... G11C 16/10; G11C 16/24; G11C 16/26; G11C 16/0483; H01L 27/11582
  (Continued)

(56) References Cited

U.S. PATENT DOCUMENTS 1,080,427 A * 12/1913 Dosch ...................... A63D 3/00
  473/116
9,059,395 B2    6/2015 Ju et al.
(Continued)

OTHER PUBLICATIONS

S. Samanta et al. 'Understanding of multi-level resistive switching mechanism in $GeO_x$ through redox reaction in $H_2O_2$/sarcosine prostate cancer biomarker detection', in *Scientific Reports*, 7: 11240, Sep. 2017, pp. 1-12.

(Continued)

*Primary Examiner* — Fernando Hidalgo
(74) *Attorney, Agent, or Firm* — Harness, Dickey & Pierce, P.L.C.

(57) ABSTRACT

Provided are a non-volatile memory device and an operating method thereof. The non-volatile memory device includes a memory cell array having a vertically stacked structure, a bit line for applying a programming voltage to the memory cell array, and a control logic. The memory cell array includes memory cells that each include a corresponding portion of a semiconductor layer and a corresponding portion of a resistance layer. The memory cells include a non-selected memory cell, a compensation memory cell, and a selected memory cell. The control logic is configured to apply an adjusted program voltage to the selected memory cell, based on applying a first voltage to the compensation memory cell, a second voltage to the selected memory cell, and a third voltage to the non-selected memory cell. The adjusted program voltage may be dropped compared to the programming voltage due to the compensation memory cell.

25 Claims, 18 Drawing Sheets

(51) Int. Cl.
*G11C 16/24* (2006.01)
*G11C 16/26* (2006.01)
*G11C 16/04* (2006.01)

(58) Field of Classification Search
USPC .................................................. 365/185.18
See application file for complete search history.

(56) References Cited

U.S. PATENT DOCUMENTS

| | | |
|---|---|---|
| 9,673,798 B1 | 6/2017 | Tang et al. |
| 9,997,530 B2 | 6/2018 | Yon et al. |
| 2008/0239799 A1 | 10/2008 | Watanabe |
| 2011/0096414 A1 | 4/2011 | David |
| 2011/0205802 A1 | 8/2011 | Choe et al. |
| 2012/0211718 A1 | 8/2012 | Shima et al. |
| 2013/0228739 A1* | 9/2013 | Sasago ............... H01L 45/04 257/4 |
| 2013/0328005 A1* | 12/2013 | Shin ............... H01L 27/2436 257/1 |
| 2014/0085961 A1 | 3/2014 | Kanamori et al. |
| 2014/0160837 A1 | 6/2014 | Ahn |
| 2016/0035420 A1 | 2/2016 | Konno et al. |
| 2016/0064454 A1* | 3/2016 | Park ............... H01L 23/528 257/5 |
| 2017/0092355 A1 | 3/2017 | Kurotsuchi et al. |

OTHER PUBLICATIONS

Extended European Search Report dated Sep. 22, 2020, issued in corresponding European Patent Application No. 20160169.7.

* cited by examiner

NON-VOLATILE MEMORY DEVICE AND OPERATING METHOD OF THE SAME

CROSS-REFERENCE TO RELATED APPLICATION

This application claims the benefit of Korean Patent Application No. 10-2019-0092660, filed on Jul. 30, 2019, in the Korean Intellectual Property Office, the disclosure of which is incorporated herein in its entirety by reference.

BACKGROUND

1. Field

The present disclosure relates to a non-volatile memory device and an operating method thereof.

2. Description of Related Art

Non-volatile memory is a semiconductor memory device and includes a plurality of memory cells each retaining information even when supply of electric power thereto is blocked and being capable of using stored information whenever the electric power is supplied thereto again. As an example of use of the non-volatile memory device, the non-volatile memory device may be used in a mobile phone, a digital camera, a personal digital assistant (PDA), a mobile computing device, a fixed computing device, and other devices.

Recently, research on using of a three-dimensional (or vertical) NAND (VNAND) in a chip forming a next-generation neuromorphic computing platform or a neural network has been conducted.

In particular, a technique allowing random access to memory cells with highly integrated and low power characteristics is demanded.

SUMMARY

Provided are non-volatile memory devices capable of inducing resistance states of various levels and operating methods thereof.

Provided are non-volatile memory devices that output a resistance state of a linear scale type and operating methods thereof.

Additional aspects will be set forth in part in the description which follows and, in part, will be apparent from the description, or may be learned by practice of the presented embodiments of the disclosure.

According to an embodiment, a non-volatile memory device includes a memory cell array having a vertically stacked structure, a bit line configured to apply a programming voltage to the memory cell array, and a control logic. The memory cell array may include a semiconductor layer and a variable resistance layer. The memory cell array may include a plurality of memory cells that each include a corresponding portion of the semiconductor layer and a corresponding portion of the variable resistance layer. The plurality of memory cells may include a non-selected memory cell, a compensation memory cell, and a selected memory cell. The control logic may be configured to apply an adjusted program voltage to the selected memory cell, the adjusted program voltage being dropped compared to the programming voltage due to the compensation memory cell, based on applying a first voltage to the compensation memory cell, a second voltage to the selected memory cell, and a third voltage to the non-selected memory cell. The first voltage may allow an electric current of a certain magnitude to flow to the compensation memory cell. The second voltage may allow the electric current to flow only to the corresponding portion of the variable resistance layer of the selected memory cell. The third voltage may allow the electric current to flow only to the semiconductor layer of the non-selected memory cell.

In some embodiments, an absolute value of the first voltage may be greater than an absolute value of the second voltage.

In some embodiments, an absolute value of the first voltage may be less than an absolute value of the third voltage.

In some embodiments, a magnitude of the first voltage may allow a resistance of the corresponding portion of the semiconductor layer in the compensation memory cell to be less than a resistance of the corresponding portion of the variable resistance layer in the compensation memory cell.

In some embodiments, a resistance of the corresponding portion of the semiconductor layer in the compensation memory cell is less than or equal to $\frac{1}{10}$ of a resistance of the corresponding portion of the variable resistance layer in the compensation memory cell.

In some embodiments, a magnitude of the first voltage may allow a resistance of the corresponding portion of the semiconductor layer in the compensation memory cell to be within a range of $10^5$ $\Omega m^{-1}$ to $10^7$ $\Omega m^{-1}$, based on the control logic applying the first voltage to the compensation memory cell.

In some embodiments, a magnitude of the first voltage allows a resistance of the corresponding portion of the variable resistance layer in the compensation memory cell to be within a range of $10^8$ $\Omega m^{-1}$ to $10^{11}$ $\Omega m^{-1}$, based on the control logic applying the first voltage to the compensation memory cell.

In some embodiments, the compensation memory cell and the selected memory cell may be connected to each other in series.

In some embodiments, the control logic may be configured to make the electric current of the certain magnitude flow to the corresponding portion of the variable resistance layer in the selected memory cell during a program operation.

In some embodiments, the corresponding portion of the semiconductor layer in the compensation memory cell and the corresponding portion of the variable resistance layer in the compensation memory cell may be connected to each other in parallel.

In some embodiments, the memory cell array may include the semiconductor layer extending in a first direction; a plurality of gates and a plurality of insulators extending in a second direction perpendicular to the first direction, the plurality of gates and the plurality of insulators being alternately arranged; a gate insulating layer extending in the first direction among the plurality of gates, the plurality of insulators, and the semiconductor layer; and the variable resistance layer extending in the first direction on the semiconductor layer.

In some embodiments, the variable resistance layer may be in contact with the semiconductor layer.

In some embodiments, the variable resistance layer may be spaced apart from the gate insulating layer with the semiconductor layer therebetween.

In some embodiments, the variable resistance layer may have a hysteresis characteristic.

In some embodiments, the variable resistance layer may include a transition metal oxide, a transition metal nitride, or both the transition metal oxide and the transition metal nitride.

In some embodiments, the compensation memory cell may be a first compensation memory cell, the plurality of memory cells may further include a second compensation memory cell, and the first compensation memory cell and the second compensation memory cell each may be connected to the selected memory cell in series.

According to an embodiment, an operating method of a non-volatile memory device is provided. The non-volatile memory device includes a memory cell array having a vertically stacked structure and including a semiconductor layer and a variable resistance layer. The memory cell array includes a plurality of memory cells that each include a corresponding portion of the semiconductor layer and a corresponding portion of the variable resistance layer. The method includes: applying a first voltage to a compensation memory cell among the plurality of memory cells, the first voltage allowing an electric current of a certain magnitude to flow to the corresponding portion of the compensation memory cell in the memory cell array; applying a second voltage to a selected memory cell among the plurality of memory cells, the second voltage allowing the electric current to flow only to the corresponding portion of the variable resistance layer in the selected memory cell of the memory cell array; applying a third voltage to a non-selected memory cell among the plurality of memory cells, the third voltage allowing the electric current to flow only to the semiconductor layer of the non-selected memory cell of the memory cell array; and applying a programming voltage, which has dropped due to the compensation memory cell, to the selected memory cell of the memory cell array.

In some embodiments, an absolute value of the first voltage may be greater than an absolute value of the second voltage.

In some embodiments, an absolute value of the first voltage may be less than an absolute value of the third voltage.

In some embodiments, a magnitude of the first voltage may allow a resistance of the corresponding portion of the semiconductor layer in the compensation memory cell to be less than a resistance of the corresponding portion of the variable resistance layer in the compensation memory cell.

In some embodiments, a resistance of the corresponding portion of the semiconductor layer in the compensation memory cell may be less than or equal to $\frac{1}{10}$ of the resistance of corresponding portion of the variable resistance layer in the compensation memory cell.

In some embodiments, a magnitude of the first voltage may allow a resistance of the corresponding portion of the semiconductor layer in the compensation memory cell to be within a range of $10^5$ $\Omega m^{-1}$ to $10^7$ $\Omega m^{-1}$.

In some embodiments, the compensation memory cell and the selected memory cell may be connected to each other in series.

In some embodiments, the corresponding portion of the semiconductor layer and the corresponding portion of the variable resistance layer in the compensation memory cell may be connected to each other in parallel According to an embodiment, a non-volatile memory device includes a substrate, a cell string on the substrate, a bit line connected to the cell string, a plurality of word lines on the substrate, and a control logic. The cell string may include a plurality of memory cells stacked on top of each other, a semiconductor layer, and a resistance change layer. Each memory cell, of the plurality of memory cells in the cell string, may include a corresponding portion of the semiconductor layer connected to a corresponding portion of a variable resistance layer. The plurality of memory cells may include a non-selected memory cell, a compensation memory cell, and a selected memory cell. The bit line may be configured to apply a programing voltage to the cell string during a program operation. The plurality of word lines may include a non-selected word line connected to the corresponding portion of the semiconductor layer of the non-selected memory cell, a compensation word line connected to the corresponding portion of the semiconductor layer of the compensation memory cell, and a selected word line connected to the corresponding portion of the semiconductor layer of the selected memory cell. The control logic, during the program operation, may be configured to apply an adjusted program voltage to the selected memory cell, based on applying a turn-on voltage to the unselected word line, applying a turn-off voltage to the selected word line, and applying a compensation voltage to the compensation word line. A magnitude of the adjusted program voltage may be less than a magnitude of the programming voltage. A magnitude of the compensation voltage may be between a magnitude of the turn-on voltage and a magnitude of the turn-off voltage.

In some embodiments, an absolute value of the compensation voltage may be greater than an absolute value of the turn-off voltage, and an absolute value of the compensation voltage may be less than an absolute value of the turn-on voltage.

In some embodiments, the compensation memory cell and the selected memory cell may be connected to each other in series, and the variable resistance layer may directly contact the semiconductor layer.

In some embodiments, the selected memory cell may be between the non-selected memory cell and the compensation memory cell.

In some embodiments, the variable resistance layer may include a transition metal oxide, a transition metal nitride, or both the transition metal oxide and the transition metal nitride.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
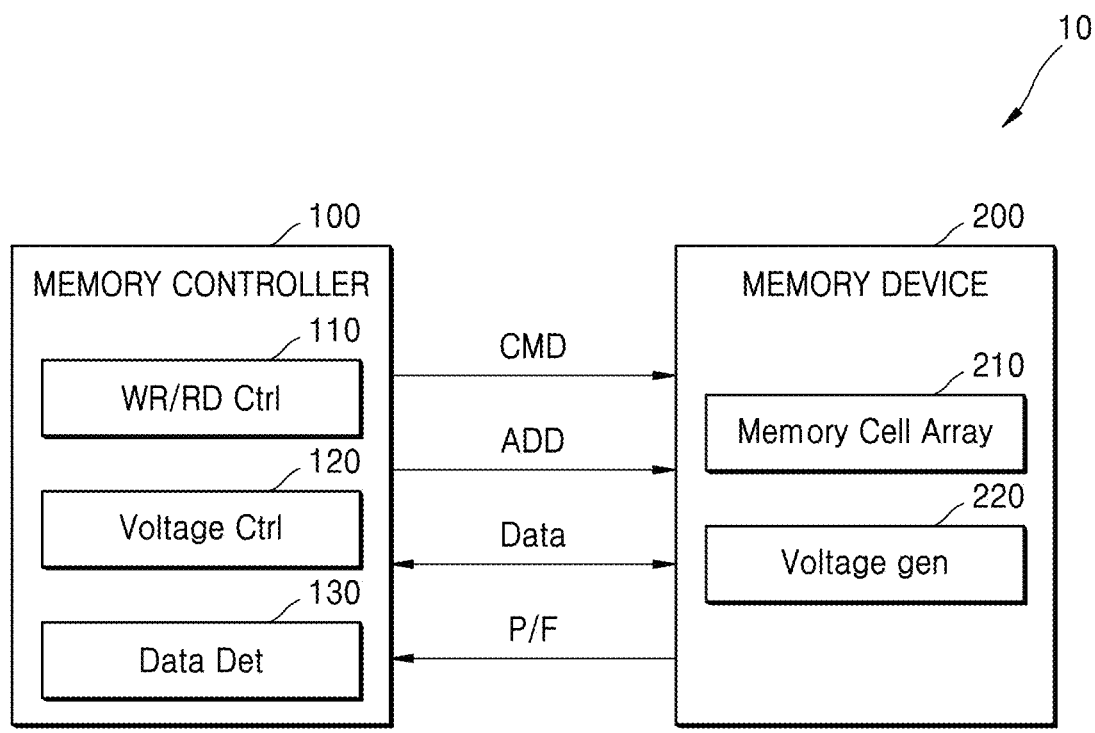
FIG. 1 is a block diagram of a memory system according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Phrases such as "in some embodiments of the disclosure" or "in one embodiment of the disclosure" throughout the specification may not necessarily denote the same embodiment of the disclosure.

Some embodiments of the disclosure may be represented as functional block structures, various processing stages and/or various processing operations. Some or all of the functional blocks may be realized by any number of hardware and/or software components configured to perform the specified functions. For example, the functional blocks of the disclosure may be realized by one or more microprocessors or circuit structures for performing a desired and/or alternatively predetermined function. In addition, for example, the functional blocks of the disclosure may be implemented with any programming or scripting language. The functional blocks may be implemented in algorithms that are executed on one or more processors. Also, the disclosure may employ any number of conventional techniques for electronics configuration, signal processing and/or, data processing and the like. The words "mechanism," "element," "means," and "configuration" are used broadly and are not limited to mechanical or physical components.

In addition, the connecting lines, or connectors shown in the various figures presented are intended to represent example functional relationships and/or physical or circuit couplings between the various elements. It should be noted that connections between elements by many alternative or additional functional relationships, physical connections or circuit connections may be present in a practical device.

The terms "consist(s) of" or "include(s) (or comprise(s))" should not be interpreted or understood as including, without exception, all of the plurality of elements or the plurality of steps disclosed in the description. In other words, it should be understood that some of the elements or some of the steps may not be included, or that additional elements or steps may be further included.

When a layer, a film, a region, or a panel is referred to as being "on" another element, it may be directly on/under/at left/right sides of the other layer or substrate, or intervening layers may also be present. Hereinafter, one or more embodiments of the disclosure will be described in detail with reference to accompanying drawings.

It will be understood that although the terms "first" and "second" are used herein to describe various elements, these elements should not be limited by these terms. Terms are only used to distinguish one element from other elements.

The disclosure will be described in detail below with reference to accompanying drawings.

FIG. 1 is a block diagram of a memory system 10 according to an embodiment.

Referring to FIG. 1, the memory system 10 may include a memory controller 100 and a memory device 200. The memory controller 100 performs a control operation with respect to the memory device 200, for example, the memory controller 100 provides the memory device 200 with an address ADD and a command CMD to perform a programming (or writing), a reading, and an erasing operation with respect to the memory device 200. Also, data for the programming operation and read data may be transmitted between the memory controller 100 and the memory device 200.

The memory device 200 may include a memory cell array 210 and a voltage generator 220. The memory cell array 210 may include a plurality of memory cells that are arranged on regions where a plurality of word lines and a plurality of bit lines intersect with each other. The memory cell array 210 includes non-volatile memory cells that store data in a non-volatile way, and as the non-volatile memory cells, the memory cell array 210 may include flash memory cells such as NAND flash memory cells or NOR flash memory cells. Hereinafter, one or more embodiments of the disclosure will be described under an assumption that the memory cell array 210 includes the flash memory cell array 210 and the memory device 200 is a non-volatile memory device.

The memory controller 100 may include a record/read controller 110, a voltage controller 120, and a data determiner 130. In example embodiments, the memory controller 100 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The memory controller 100 may operate in response to requests from a host (not shown) and may be configured to access the memory device 200 and control operations discussed below, thereby transforming the memory controller 100 into a special purpose controller. As discussed below, the memory controller 100 may improve the functioning of the memory device 200 by reducing and/or suppressing a dielectric breakdown and current overshoot of a selected memory cell and/or by allowing multi-resistance states to be recorded in memory cells of the memory device 200.

The record/read controller 110 may generate an address ADD and a command CMD for performing programming/reading/erasing operations on the memory cell array 210. Also, the voltage controller 120 may generate a voltage control signal for controlling at least one voltage level used in the non-volatile memory device 200. As an example, the voltage controller 120 may generate the voltage control signal for controlling a voltage level of a word line for reading data from or programming data on the memory cell array 210.

In addition, the data determiner 130 may perform a determination operation on the data read from the non-volatile memory device 200. For example, by determining the data read from the memory cells, the number of on-cells and/or off-cells from among the memory cells may be determined. As an operating example, when programming is performed on a plurality of memory cells, states of the data from the memory cells are determined by using a desired and/or alternatively predetermined reading voltage to determine whether the programming is normally finished on every cell. Alternatively or additionally, the memory device 200 may provide the memory controller 100 a pass/fail signal P/F according to a read result with respect to the read data. The memory controller 100 may refer to the pass/fail signal P/F and thus control write and read operations of the memory cell array 210.

As described above, the memory cell array 210 may include non-volatile memory cells, for example, the memory cell array 210 may include flash memory cells. Also, the flash memory cells may be implemented in various types, for example, the memory cell array 210 may include three-dimensional (or vertical) NAND (VNAND) memory cells.

Figure 2:
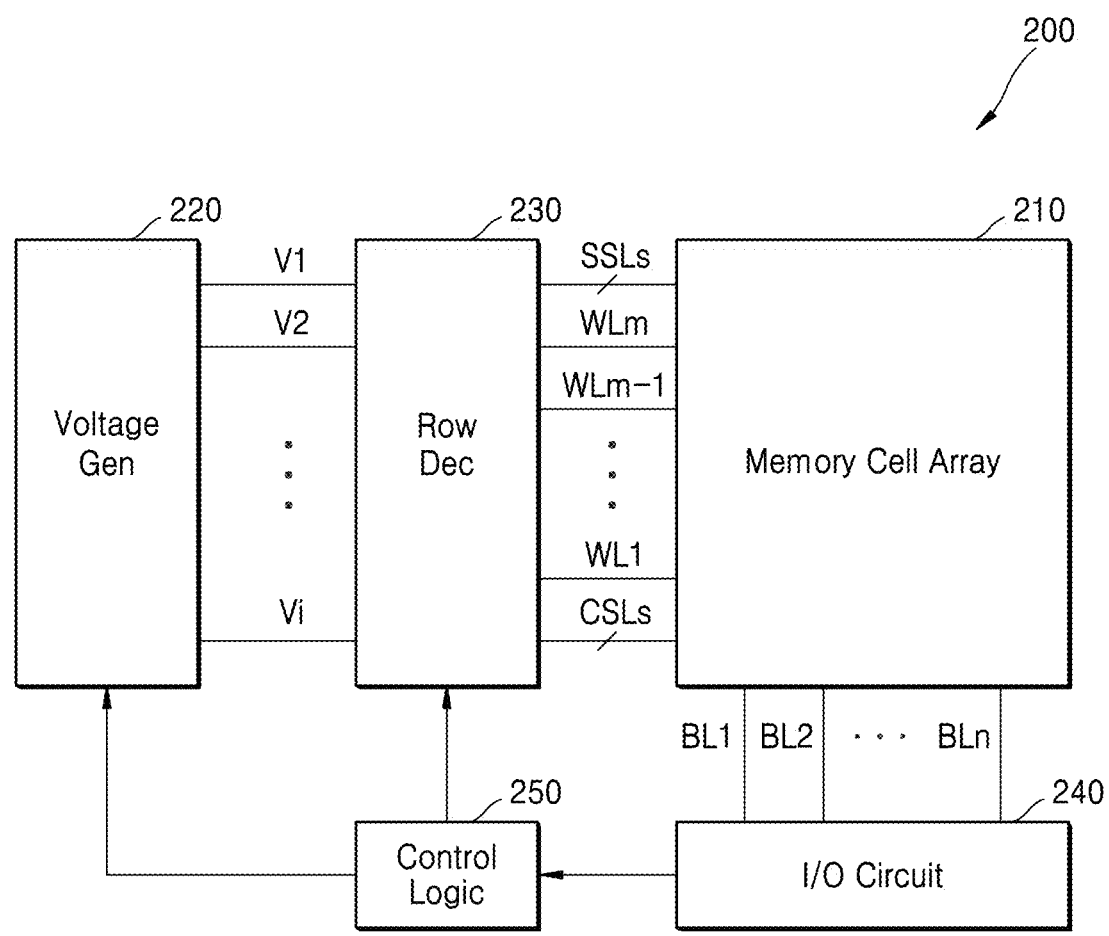
FIG. 2 is a block diagram of an implemented example of the memory device of FIG. 1.

FIG. 2 is a block diagram of an implemented example of the memory device 200 of FIG. 1.

As shown in FIG. 2, the memory device 200 may further include a row decoder 230, an input/output circuit 240, and a control logic 250.

The memory cell array 210 may be connected to one or more string selection lines SSL, a plurality of word lines WL (WL1 to WLm, including normal word lines WL and dummy word lines WL), and one or more common source lines CSL, and may be also connected to a plurality of bit lines BL1 to BLn. The voltage generator 220 may generate one or more word line voltages V1 to Vi that may be provided to the row decoder 230. Signals for programming/reading/erasing operations may be applied to the memory cell array 210 via the bit lines BL1 to BLn.

Also, data to be programmed may be provided to the memory cell array 210 via the input/output circuit 240 and the read data may be provided to outside (e.g., memory controller) via the input/output circuit 240. In example embodiments, the control logic 250 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The control logic 250 may operate in response to requests from memory controller 100 (see FIG. 1) and the control logic 250 may provide the row decoder 230 and the voltage generator 220 with various control signals related to the memory operations under the control of the memory controller 100. As discussed below, the control logic 250 may improve the functioning of the memory device 200 by reducing and/or suppressing a dielectric breakdown and current overshoot of a selected memory cell and/or by allowing multi-resistance states to be recorded in memory cells of the memory device 200.

According to a decoding operation of the row decoder 230, the word line voltages V1 to Vi may be provided to various lines SSL, WL1 to WLm, and CSL. For example, the word line voltages V1 to Vi may include a string selection voltage, word line voltages, and ground selection voltages. The string selection voltage may be provided to one or more string selection lines SSL, the word line voltages may be provided to one or more word lines WL1 to WLm, and the ground selection voltages may be provided to one or more common source lines CSL.

Figure 3:
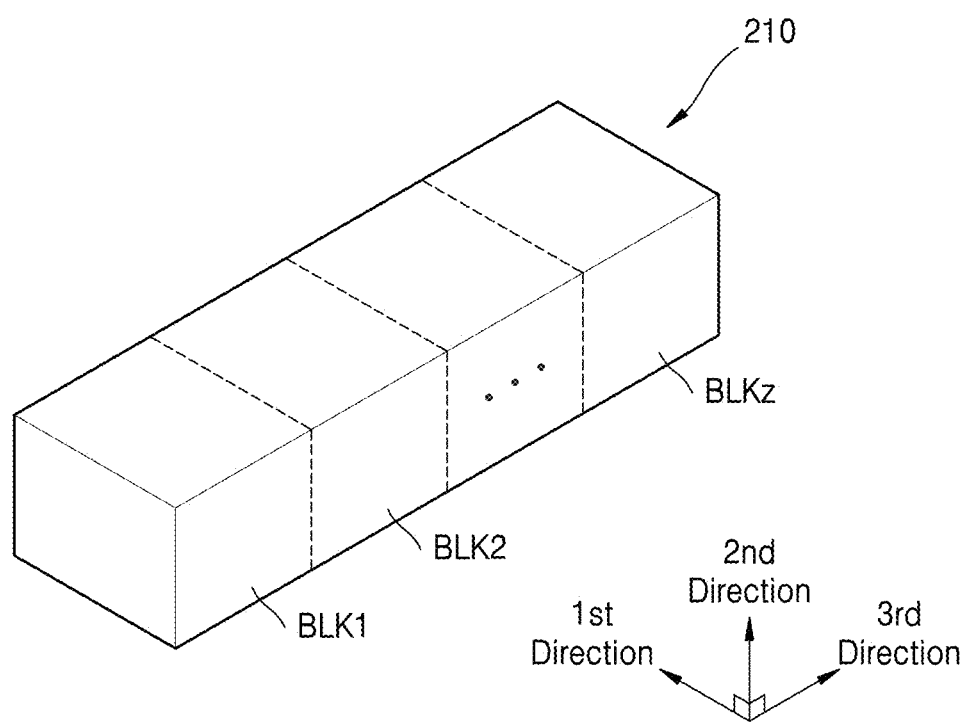
FIG. 3 is a block diagram of a memory cell array of FIG. 1.

FIG. 3 is a block diagram of the memory cell array 210 of FIG. 1.

Referring to FIG. 3, the memory cell array 210 includes a plurality of memory blocks BLK (BLK1 to BLKz). Each of the memory blocks BLK (BLK1 to BLKz) has a three-dimensional (or vertical) structure. For example, each memory block BLK includes structures extending in first to third directions. For example, as discussed with reference to FIG. 4, each memory block BLK includes a plurality of cell strings CS extending in the second direction. For example, the plurality of cell strings CS are provided in the first to third directions.

Each of the cell strings CS is connected to the bit line BL, the string selection line SSL, the word lines WL, and the common source line CSL. That is, each of the memory blocks BLK (BLK1 to BLKz) is connected to the plurality of bit lines BL, the plurality of string selection lines SSL, the plurality of word lines WL, and the plurality of common source lines CSL. The memory blocks BLK (BLK1 to BLKz) will be described in more detail below with reference to FIG. 4.

Figure 4:
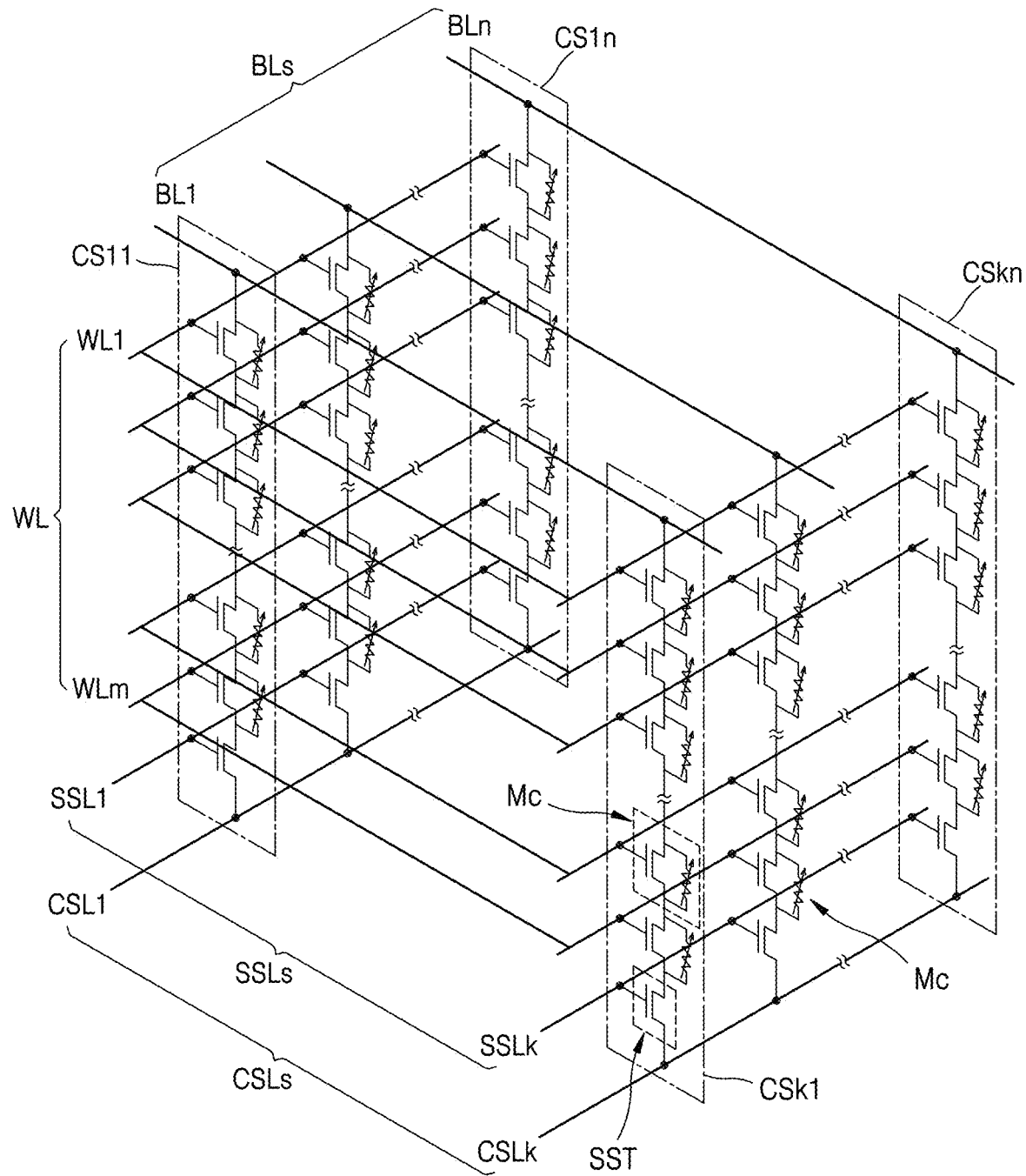
FIG. 4 is a diagram of an equivalent circuit corresponding to a memory block according to an embodiment.

FIG. 4 is a diagram of an equivalent circuit corresponding to a memory block BLKi according to an embodiment. As an example, one of the memory blocks BLK (BLK1 to BLKz) in the memory cell array 210 of FIG. 3 is shown in FIG. 4.

Referring to FIG. 3 and FIG. 4, the memory block BLKi includes a plurality of cell strings CS (for example, CS11 to CSkn). The plurality of cell strings CSs are arranged in rows and columns.

Each of the cell strings CS11 to CSkn includes memory cells MC and a string selection transistor SST. The memory cells MC in each of the cell strings CS11 to CSkn and the string selection transistors SST may be stacked in a height direction.

The plurality of rows of the cell strings CS11 to CSkn are respectively connected to different string selection lines SSL1 to SSLk. For example, the string selection transistors SST in the cell strings CS11 to CS1n are commonly connected to the string selection line SSL1. The string selection transistors SST in the cell strings CSk1 to CSkn are commonly connected to the string selection line SSLk.

The plurality of columns of the cell strings CS are respectively connected to different bit lines BL1 to BLn. For example, the memory cells MC and the string selection transistors SST in the cell strings CS11 to CSk1 may be commonly connected to the bit line BL1, and the memory cells MC and the string selection transistors SST in the cell strings CS1n to CSkn may be commonly connected to the bit line BLn.

The plurality of rows of the cell strings CS may be respectively connected to different common source lines CSL1 to CSLk. For example, the string selection transistors SST in the cell strings CS11 to CS1n may be commonly connected to the common source line CSL1 and the string selection transistors SST of the cell strings CSk1 to CSkn may be commonly connected to the common source line CSLk.

The memory cells at the same height from the substrate (or the string selection transistors SST) are commonly connected to a same word line WL and the memory cells at different heights from the substrate (or the string selection transistors SST) may be respectively connected to different word lines WL1 to WLm.

The memory block BLKi shown in FIG. 4 is an example. One or more embodiments are not limited to the memory block BLKi shown in FIG. 4. For example, the number of rows of the cell strings CS may be increased or decreased. As the number of rows of the cell strings CS varies, the number of string selection lines connected to the rows of the cell strings CS and the number of cell strings CS connected to one bit line may also vary. As the number of rows of the cell strings CS varies, the number of common source lines connected to the rows of the cell strings CS may also vary.

The number of columns of the cell strings CS may be also increased or decreased. As the number of columns of the cell strings CS varies, the number of bit lines connected to the columns of the cell strings CS and the number of cell strings CS connected to one string selection line may also vary.

The height of the cell strings CS may increase or decrease. For example, the number of memory cells stacked in each of the cell strings CS may increase or decrease. As the number of memory cells stacked in each of the cell strings CS varies, the number of word lines WL may also vary. For example, the number of string selection transistors provided to each of the cell strings CS may increase. As the number of string selection transistors provided to each of the cell strings CS varies, the number of the string selection lines or the common source lines may also vary. As the number of string selection transistors increases, the string selection transistors may be stacked like the memory cells MC.

For example, writing and reading operations may be performed in units of rows of the cell strings CS. The cell strings CS are selected by the common source lines CSL in units of one row and may be selected by the string selection lines SSL in units of one row. Also, the voltage may be applied in units of at least two common source lines CSL. The voltage may be applied in units of total common source lines CSL.

In a selected row of the cell strings CS, the programming and reading operations may be performed in units of pages. A page may denote one row of memory cells MCconnected to one word line WL. In the selected row of the cell strings CS, the memory cells MC may be selected by the word lines WL in units of pages.

In addition, each of the memory cells MC may correspond to a circuit in which a transistor and a resistor are connected in parallel.

Figure 5:
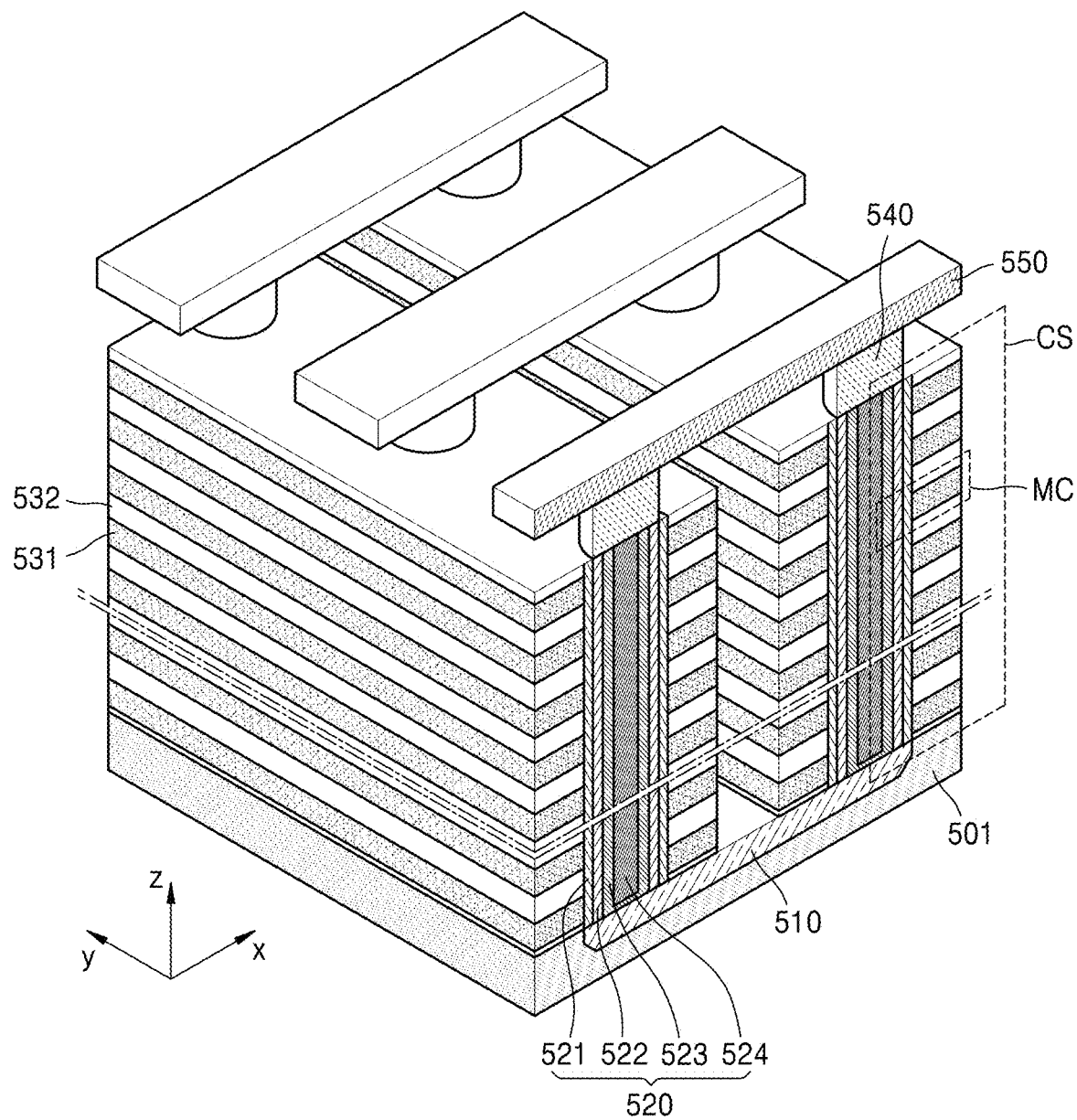
FIG. 5 is a diagram showing a physical structure corresponding to a memory block according to an embodiment.
Figure 6A:
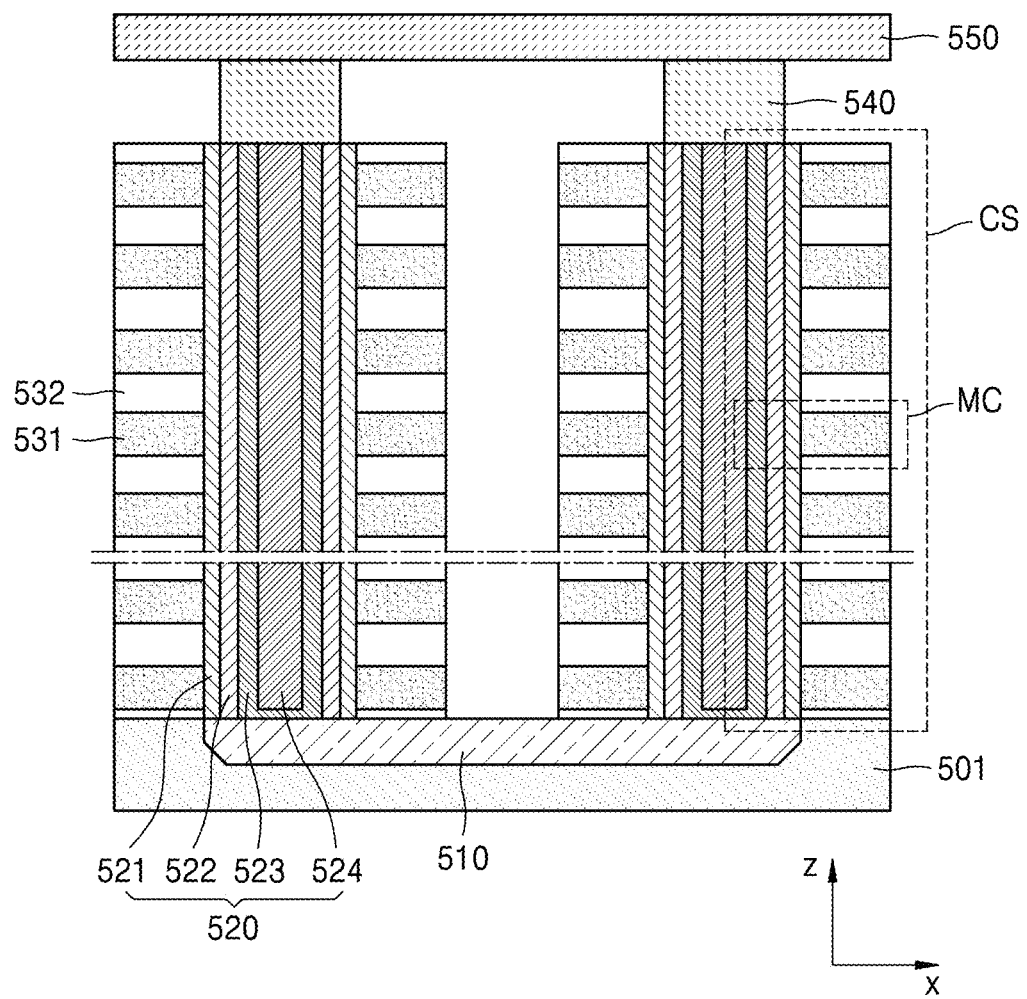
FIG. 6A is an XZ cross-sectional view of the memory block of FIG. 5.
Figure 6B:
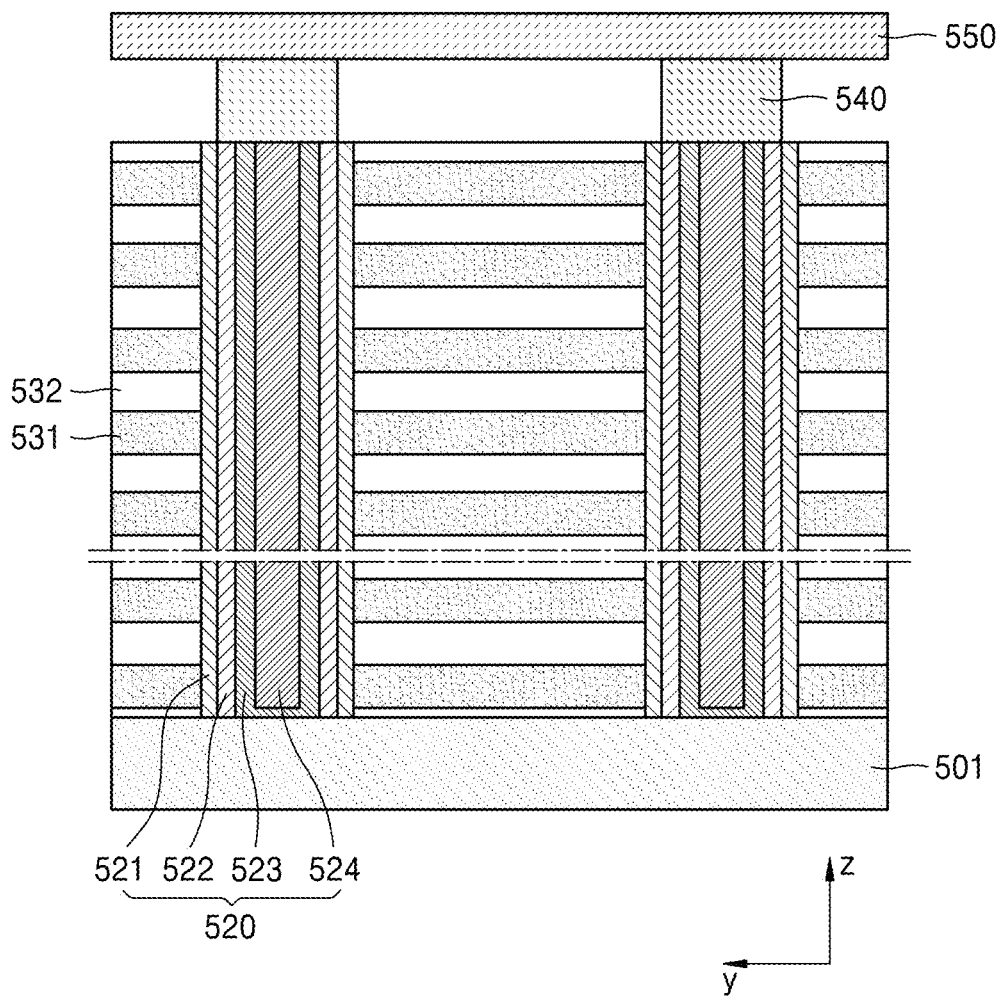
FIG. 6B is a YZ cross-sectional view of the memory block of FIG. 5.

FIG. 5 is a diagram showing a physical structure corresponding to a memory block according to an embodiment, FIG. 6A is a cross-sectional diagram of the memory block of FIG. 5 in an XZ plane, and FIG. 6B is a cross-sectional view of the memory block of FIG. 5 in a YZ plane.

Referring to the drawings, a substrate 501 is prepared. The substrate 501 may include a silicon material doped with first type impurities. For example, the substrate 501 may include a silicon material doped with p-type impurities. For example, the substrate 501 may include a p-type well (e.g., a pocket p-well). Hereinafter, it will be assumed that the substrate 501 includes p-type silicon. However, the substrate 501 is not limited to the p-type silicon.

A doping region 510 is provided in the substrate 501. For example, the doping region 510 may be of a second type that is different from that of the substrate 501. For example, the doping region 510 may be of an n-type. Hereinafter, it will be assumed that the doping region 510 is of the n-type. However, the doping region 510 is not limited to the n-type. The doping region 510 may be a common source line.

On the substrate 501, a plurality of gates 531 and a plurality of insulators 532 extending in a horizontal direction may be alternately arranged. That is, the plurality of gates 531 and the plurality of insulators 532 may be stacked alternately with each other along a vertical direction that is perpendicular to the horizontal direction. For example, the gate 531 may include a metal material (e.g., copper, silver, etc.) and the insulator 532 may include silicon oxide, but are not limited thereto. Each of the gates 531 is connected to one of the word line WL and the string selection line SSL.

A pillar 520 is provided to penetrate through the plurality of gates 531 and the plurality of insulators 532 in the vertical direction, wherein the plurality of gates 531 and the plurality of insulators 532 are alternately arranged.

The pillar 520 may include a plurality of layers. In an embodiment, an outermost layer of the pillar 520 may be a gate insulating layer 521. For example, the gate insulating layer 521 may include silicon oxide. The gate insulating layer 521 may be conformally stacked on the pillar 520.

Also, a semiconductor layer 522 may be conformally deposited on an internal surface of the gate insulating layer 521. In an embodiment, the semiconductor layer 522 may include a silicon material doped with the first type impurities. The semiconductor layer 522 may include a silicon material doped with the same type as that of the substrate 501. For example, when the substrate 501 includes the silicon material doped with p-type impurities, the semiconductor layer 522 may also include the silicon material doped with the p-type impurities. Alternatively, the semiconductor layer 522 may include a material such as Ge, IGZO, GaAs, etc.

A variable resistance layer 523 may be arranged along the internal surface of the semiconductor layer 522. The variable resistance layer 523 may be arranged to be in contact with the semiconductor layer 522 and may be conformally stacked on the semiconductor layer 522. In an embodiment, the variable resistance layer 523 may include a material having a resistance that varies depending on an applied voltage. The variable resistance layer 523 may switch from a high resistance state to a low resistance state or from the low resistance state to the high resistance state, according to the voltage applied to the gate 531. The above variable resistance may be caused by oxygen vacancies in the variable resistance layer 523 or may be caused by the change in a current conducting mechanism due to trapping/de-trapping of electrons in the variable resistance layer 523.

The variable resistance layer 523 may include a material having a hysteresis characteristic. For example, the variable resistance layer 523 may include a transition metal oxide and/or a transition metal nitride. In detail, the variable resistance layer 523 may include oxide of at least one element selected from the group consisting of zirconium (Zr), hafnium (Hf), aluminum (Al), nickel (Ni), copper (Cu), molybdenum (Mo), tantalum (Ta), titanium (Ti), tungsten (W), chromium (Cr), strontium (Sr), lanthanum (La), manganese (Mn), calcium (Ca), praseodymium (Pr), and silicon (Si). Also, the variable resistance layer 523 may include silicon nitride and aluminum nitride.

An insulating layer 524 may be filled in the variable resistance layer 523. For example, the insulating layer 524 may include silicon oxide.

The semiconductor layer 522 and the variable resistance layer 523 may be in contact with the doping region 510, e.g., a common source region.

A drain 540 may be provided on the pillar 520. The drain 540 may include a silicon material doped with the second type impurities. For example, the drain 540 may include the silicon material doped with n-type impurities.

A bit line 550 may be provided on the drain 540. The drain 540 and the bit line 550 may be connected to each other via contact plugs. The bit line 550 may include a metal material and/or a semiconductor material, e.g., polysilicon. The bit line may be formed of conductive material.

As compared with FIG. 4, the plurality of gates 531, the plurality of insulators 532, the gate insulating layer 521, the semiconductor layer 522, and the variable resistance layer 523 are elements of the cell strings CS. In detail, the gates 531, the gate insulating layer 521, and the semiconductor layer 522 are elements of the transistor and the variable resistance layer 523 may be a resistor.

As shown in the drawings, since the semiconductor layer 522 of the transistor and the variable resistance layer 523 is directly bonded to each other, the variable resistance layer 523 may have the high resistance state or the low resistance state to record data on the memory cells MC. The semiconductor layer 522 of the transistor and the variable resistance layer 523 is connected in parallel in each of the memory cells MC, and the parallel connecting structures are successively arranged in the vertical direction to form the cell string CS. In addition, the common source line 510 and the bit line 550 may be connected to opposite ends of the cell string CS. When the voltage is applied to the common source line 510 and the bit line 550, the programming, reading, and erasing operations may be performed on the plurality of memory cells MC.

According to inventive concepts, the memory block includes the variable resistance layer 523 instead of using a phase change material, and thus issues such as heat generation and stress (pressure) caused when the phase change material is used may be addressed. Also, since the memory block is configured as described above and operated, even when the memory cells included in the memory block are repeatedly operated, ion transfer between adjacent memory cells and leakage current and operation failure due to the ion transfer may be prevented. Density in the memory block may increase because a scaling issue between the memory cells in a next-generation VNAND may be addressed.

The memory block according to the embodiment of the disclosure may be implemented as a chip to be used as a neuromorphic computing platform. In addition, the memory block according to the embodiment of the disclosure may be implemented as a chip to be used to configure a neural network.

The memory controller 100 may control the memory device 200 to operate in a programming mode.

Figure 7:
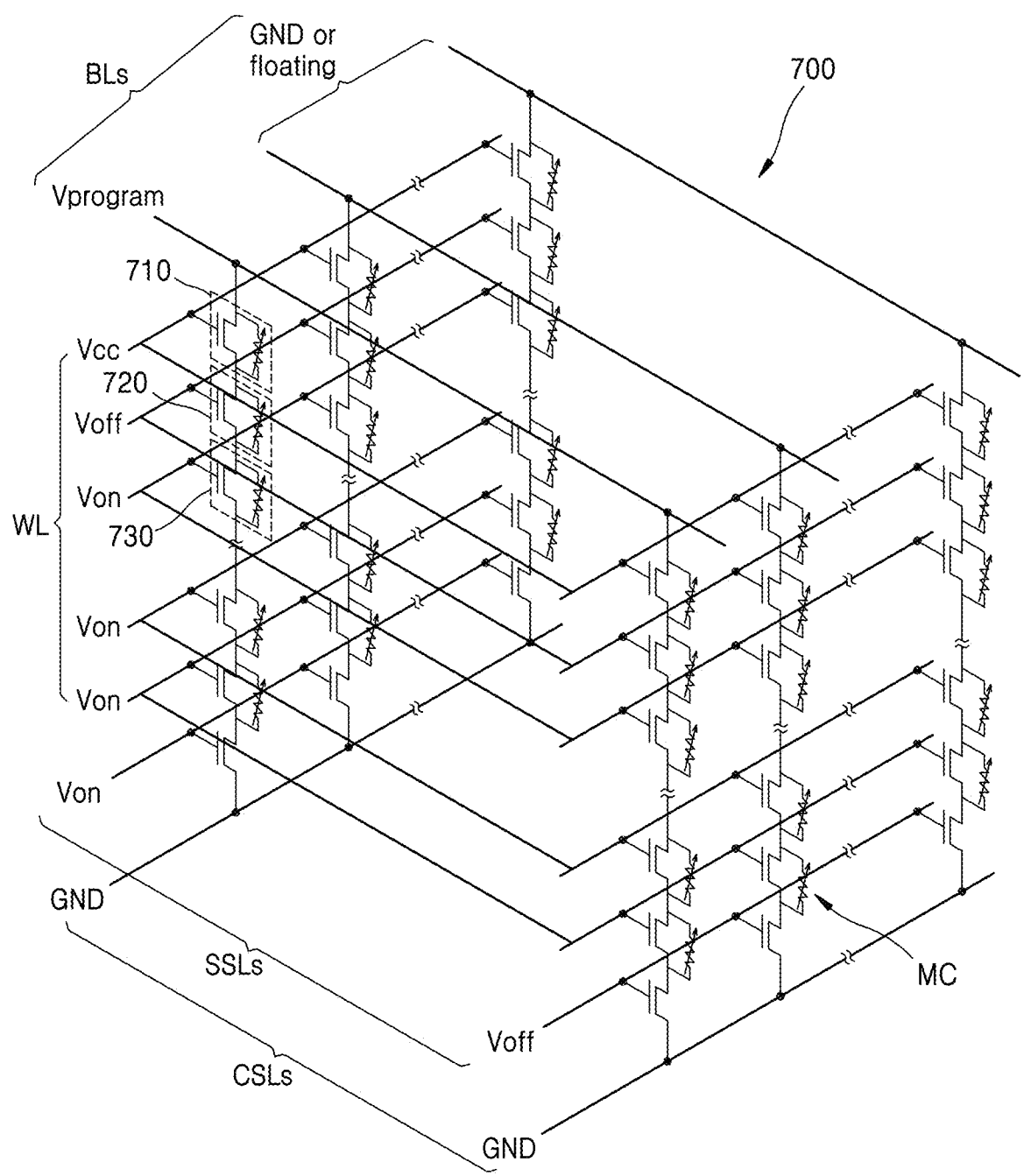
FIG. 7 is a diagram of the equivalent circuit of the memory block of FIG. 4 operating in a programming mode of the non-volatile memory device, according to the embodiment.

FIG. 7 is a diagram of the equivalent circuit of a memory block 700 according to FIG. 4, in a programming mode of the non-volatile memory device according to the embodiment.

In FIG. 7, each of a plurality of memory cells 710, 720, and 730 may include the gate 531, gate insulating layer 521, the variable resistance layer 523, and the semiconductor layer 522 of FIG. 5.

The plurality of memory cells 710, 720, and 730 in the memory block 700 may include a compensation memory cell 710, a selected memory cell 720, and a non-selected memory cell 730. A programming mode of a non-volatile memory device denotes a mode in which a programming operation is performed on the memory cell MC and the memory cell MC that is a target of the programming operation may be referred to as the selected memory cell 720. In addition, the memory cell MC that is not a target of the programming operation may be referred to as the non-selected memory cell 730.

The compensation memory cell 710 may denote the memory cell MC that adjusts a magnitude of electric current flowing on the selected memory cell 720. Since the compensation memory cell 710 and the selected memory cell 720 are connected in series, when the magnitude of the electric current flowing in the compensation memory cell 710 is controlled, a magnitude of electric current flowing in the selected memory cell 720 may be controlled.

The control logic 250 may control a turn-on voltage Von to be applied to a string selection line SSL connected to the selected memory cell 720, from among the plurality of string selection lines SSL. In addition, from among the plurality of word lines WL, the control logic 250 applies a compensation voltage Vcc to a word line WL connected to the compensation memory cell 710, applies a turn-off voltage Voff to a word line WL connected to the selected memory cell 720, and applies the turn-on voltage Von to the word line WL connected to the non-selected memory cell 730.

The compensation voltage Vcc may be a voltage allowing an electric current of a certain magnitude to flow on the compensation memory cell 710, for example, the electric current of a certain magnitude may flow on the semiconductor layer 522 of the compensation memory cell 710. The turn-off voltage Voff is a voltage of a magnitude for turning off the transistor and may prevent the electric current from flowing on the semiconductor layer 522 of the transistor included in the selected memory cell 720. The turn-on voltage Von is a voltage of a magnitude for turning on the transistor and may allow the electric current to flow only on the semiconductor layer 522 of the transistor included in the non-selected memory cell 730.

Magnitudes of the compensation voltage Vcc, the turn-off voltage Voff, and the turn-on voltage Von may vary depending on kinds, thickness, etc. of the materials included in the gate 531, the gate insulating layer 521, the semiconductor layer 522, and the variable resistance layer 523 in the memory cell MC. An absolute value of the turn-on voltage Von is generally greater than an absolute value of the turn-off voltage Voff.

An absolute value of the compensation voltage Vcc may be less than that of the turn-on voltage Von and greater than that of the turn-off voltage Voff. Also, the compensation voltage Vcc may have a magnitude making the resistance of the semiconductor layer 522 less than that of variable resistance layers 523 and 523c in the compensation memory cell 710. For example, the compensation voltage Vcc may have a magnitude that makes the resistance of the semiconductor layer 522 in the compensation memory cell 710 equal to or less than 1/10 of the resistance of the variable resistance layer 523 in the compensation memory cell 710.

Alternatively, the compensation voltage Vcc may be in a range in which the resistance of the semiconductor layer 522 in the compensation memory cell 710 is $10^5$ $\Omega m^{-1}$ to $10^7$ $\Omega m^{-1}$ or the resistance of the variable resistance layer 523 of the compensation memory cell 710 is $10^8$ $\Omega m^{-1}$ to $10^{11}$ $\Omega m^{-1}$.

Since the semiconductor layer 522 and the variable resistance layer 523 in the compensation memory cell 710 are connected in parallel and the resistance of the semiconductor layer 522 is relatively less than the resistance of the variable resistance layer 523, the magnitude of the electric current flowing on the compensation memory cell 710 may be determined according to the magnitude of the electric current flowing on the semiconductor layer 522 of the compensation memory cell 710. Thus, the magnitude of the electric current flowing on the compensation memory cell 710 may be determined according to the magnitude of the compensation voltage Vcc applied to the transistor of the compensation memory cell 710.

In addition, a programming voltage Vprogram may be applied to a bit line BL connected to the selected memory cell 720, from among the plurality of bit lines BL. The programming voltage Vprogram may be provided from outside, e.g., the memory controller 100, via the input/output circuit 240. The programming voltage Vprogram is a voltage for recording data on the memory cell MC and the magnitude of the programming voltage Vprogram may vary depending on the data.

The bit line BL that is not connected to the selected memory cell 720, from among the plurality of bit lines BL, may be grounded or floated. Since the bit line that is not connected to the selected memory cell 720 is grounded or floated, electric power loss because of the leakage current may be prevented. Thus, the control logic 250 may perform the programming operation on the selected memory cell 720.

In the programming mode, because the turn-off voltage Voff is applied to the selected memory cell 720, the semiconductor layer 522 of the selected memory cell 720 may have an insulating property. In addition, since the turn-on voltage Von is applied to the non-selected memory cell 730, the semiconductor layer 522 of the non-selected memory cell 730 may have a conductive property. Therefore, there is a voltage difference between the compensation memory cell 710 and the selected memory cell 720 due to the programming voltage Vprogram.

Since the electric current of a certain magnitude flows on the compensation memory cell 710, a programming voltage Vprogram' that is voltage-dropped by the compensation memory cell 710 is applied to the selected memory cell 720. The programming voltage Vprogram' (also referred to as adjusted program voltage) is less than the programming voltage Vprogram. Thus, dielectric breakdown and current overshoot of the selected memory cell 720 due to the programming voltage Vprogram may be limited and/or suppressed.

Figure 8:
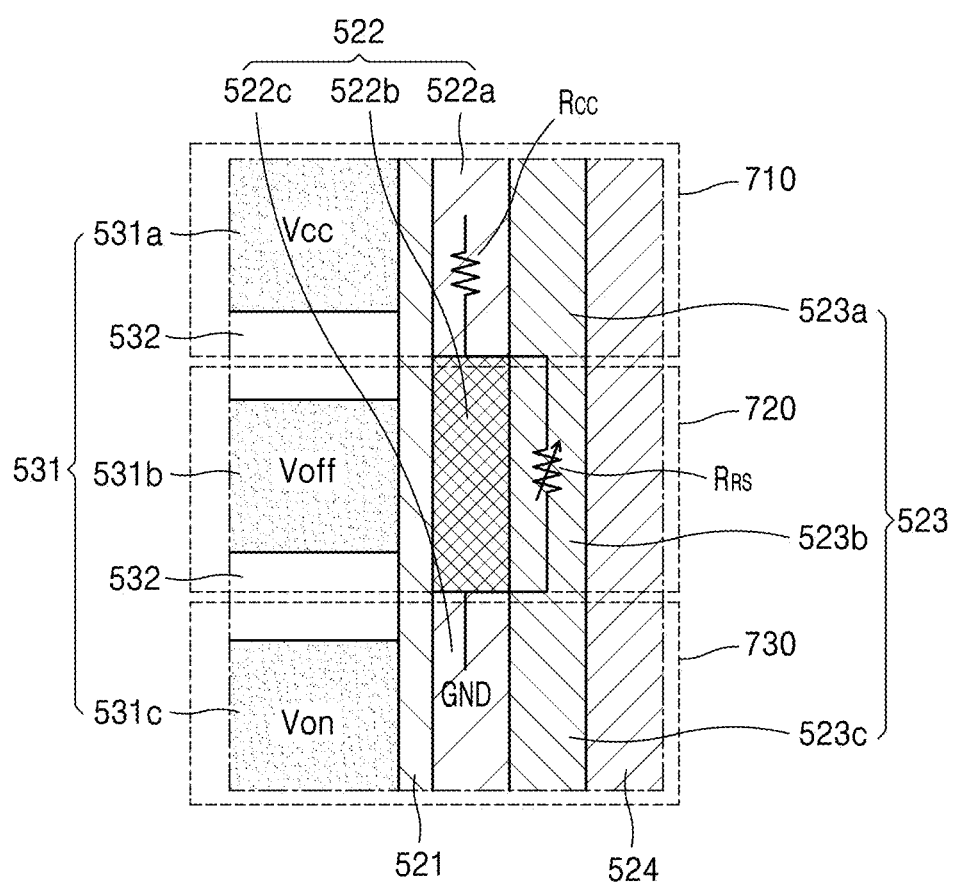
FIG. 8 is a diagram illustrating relationship between resistances of a compensation memory cell and a selected memory cell in a programming mode according to an embodiment.

FIG. 8 is a diagram illustrating relationship between resistances of the compensation memory cell 710 and the selected memory cell 720 in a programming mode according to an embodiment.

As shown in FIG. 8, the memory block may include the gates 531, the insulators 532, the gate insulating layer 521, the semiconductor layer 522, the variable resistance layer 523, and the insulating layer 524 on a substrate (not shown). The gate insulating layer 521, the semiconductor layer 522, the variable resistance layer 523, and the insulating layer 524 may extend in a first direction. The gates 531 and the insulating layer 524 may alternately extend in a second direction that is perpendicular to the first direction.

In addition, the gates 531, the insulators 532, the gate insulating layer 521, and the semiconductor layer 522 are elements of the transistor, and the variable resistance layer 523 may correspond to a resistor.

In the programming mode, the control logic 250 may control the compensation voltage Vcc to be applied to a gate 531a of the compensation memory cell 710, the turn-off voltage Voff to be applied to a gate 531b of the selected memory cell 720, and the turn-on voltage Von to be applied to a gate 531c of the non-selected memory cell 730. Thus, a semiconductor layer 522b of the selected memory cell 720 has an insulating property and a semiconductor layer 522c of the non-selected memory cell 730 may have a conductive property. When the programming voltage Vprogram is applied to a bit line that is electrically connected to the selected memory cell 720, there is a voltage difference between the compensation memory cell 710 and the selected memory cell 720.

In addition, since the electric current of a certain magnitude flows on the compensation memory cell 710 due to the compensation voltage Vcc and the compensation memory cell 710 and the selected memory cell 720 are connected in series, the above voltage difference may be distributed to the compensation memory cell 710 and the selected memory cell 720. That is, the magnitude of the electric current flowing on the selected memory cell 720 is controlled by the compensation voltage Vcc applied to the compensation memory cell 710, and the programming voltage Vprogram' that is dropped due to the compensation memory cell 710 may be applied to the selected memory cell 720.

Since the magnitude of the electric current flowing on the selected memory cell 720 is controlled by the compensation memory cell 710, and the dielectric breakdown and electric current overshoot of the selected memory cell 720 in the programming mode may be limited and/or suppressed. Also, since the magnitude of the electric current flowing on the selected memory cell 720 may be adjusted by adjusting the magnitude of the compensation voltage Vcc applied to the compensation memory cell 710, the selected memory cell 720 may have resistance states of various levels. Thus, more information may be recorded on the memory cell MC.

Since oxygen vacancies in the variable resistance layer 523b of the selected memory cell 720 move towards the semiconductor layer 522b due to the voltage difference, the variable resistance layer 523b may be in the low resistance state. The variable resistance layer 523b of the selected memory cell 720 in the low resistance state may denote that the value of resistor included in the selected memory cell 720 is decreased.

Figure 9A:
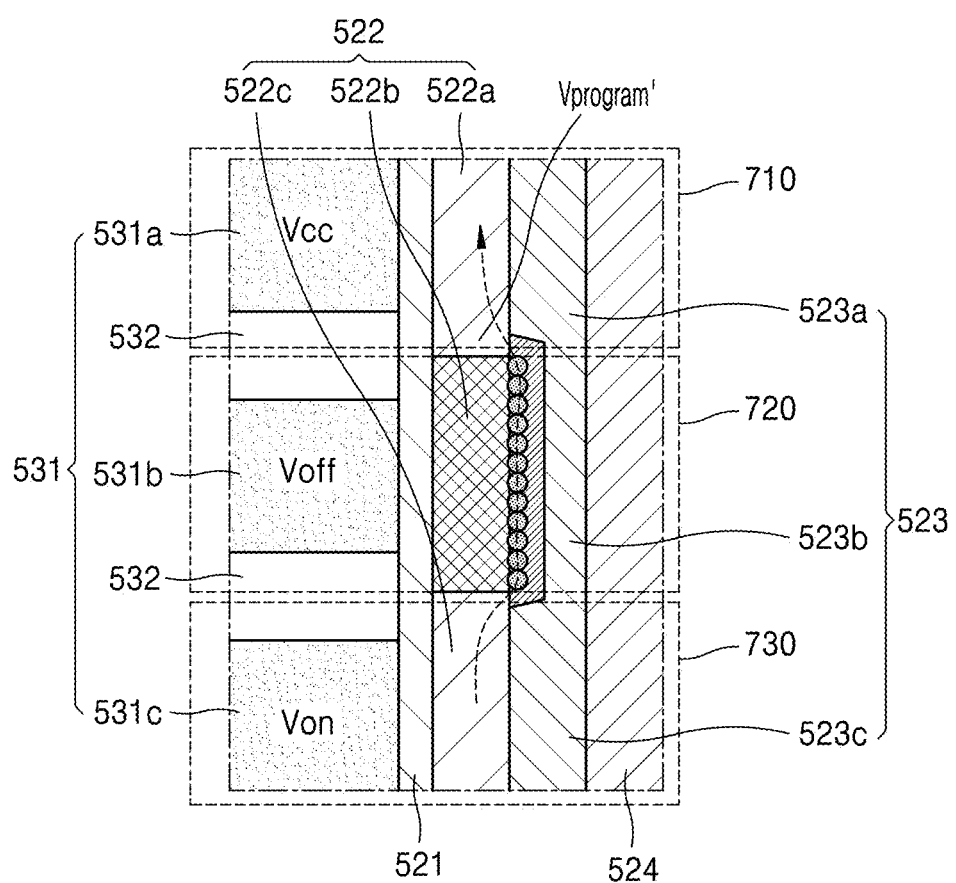
FIGS. 9A and 9B are diagrams regarding a current movement in a resistance variable layer in a programming mode according to an embodiment.
Figure 9B:
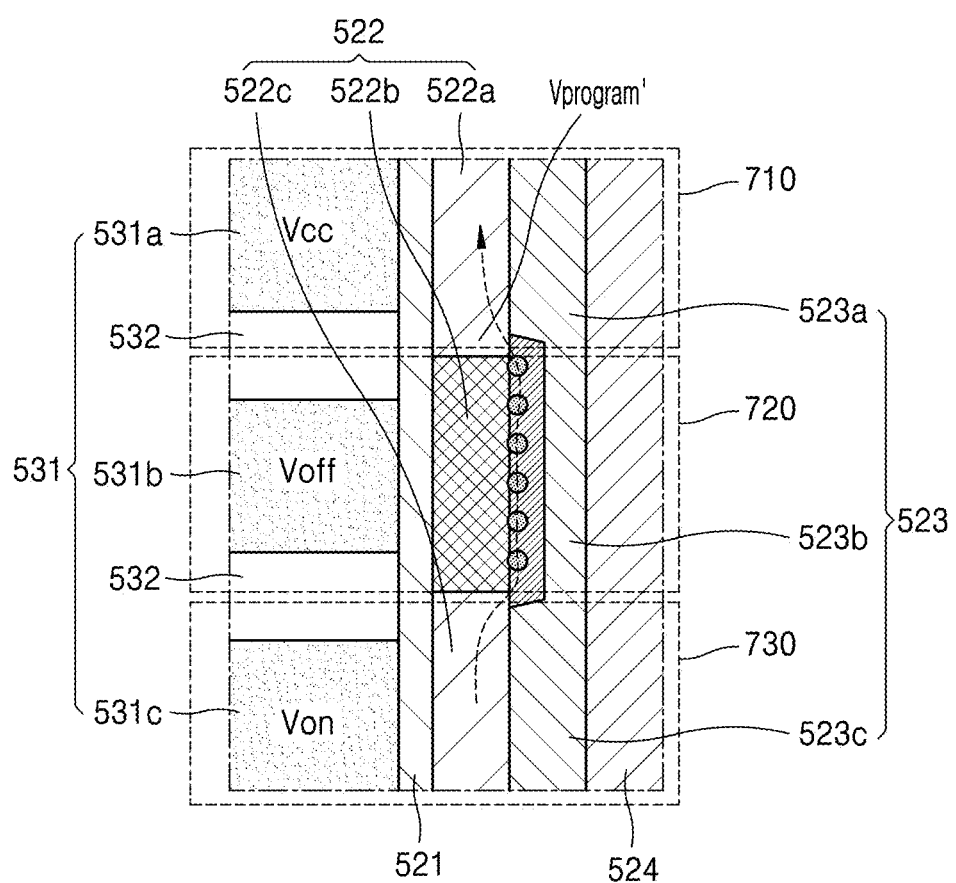

FIGS. 9A and 9B are diagrams regarding a current movement in the variable resistance layer 523 in a programming mode according to an embodiment.

The dropped programming voltage Vprogram' may allow the oxygen vacancies in the variable resistance layer 523b corresponding to the selected memory cell 720 to move towards the semiconductor layer 522b. As shown in FIG. 9A, when a density of oxygen vacancies is high at a region in the variable resistance layer 523b, which is adjacent to the semiconductor layer 522b, a conductive filament is generated. Thus, the variable resistance layer 523b is in the low resistance state and the selected memory cell 720 may have an ohmic conductive property.

Alternatively, as shown in FIG. 9B, when the density of the oxygen vacancies at the region of the variable resistance layer 523b, which is adjacent to the semiconductor layer 522b, the dropped programming voltage Vprogram' may allow electrons to be filled in traps that are spaced apart from one another with constant intervals in the variable resistance layer 523b. Thus, the variable resistance layer 523b is in the low resistance state due to the change in the current conducting type, and the selected memory cell 720 may have a bulk conductive property such as Hopping, SCLC, and Poole-Frenkel.

Figure 10:
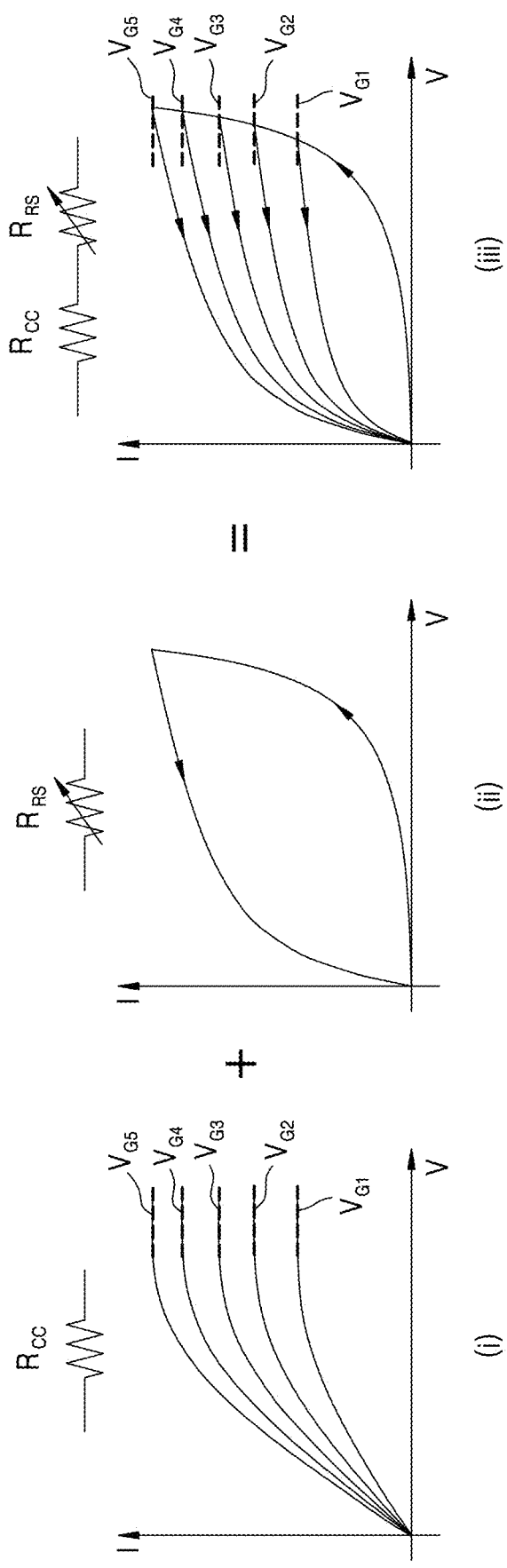
FIG. 10 is a reference diagram illustrating the concept of a resistance variable layer capable of ensuring a multi-resistance state according to an embodiment.

FIG. 10 is a reference diagram illustrating concept of the variable resistance layer 523 capable of ensuring multi-resistance state according to an embodiment.

In FIG. 10, (i) denotes a current-voltage characteristic of the transistor in the compensation memory cell 710. The electric current flowing on the semiconductor layer 522 of the transistor may vary depending on the voltage applied to the gate 531 of the transistor, and this denotes that the current applied to the selected memory cell 720 may be controlled by controlling the voltage applied to the gate 531 of the transistor.

In FIG. 10, (ii) denotes a current-voltage characteristic of the variable resistance layer 523 included in the selected memory cell 720. The variable resistance layer 523 of the selected memory cell 720 may have hysteresis characteristic. The variable resistance layer 523 of the memory cell MC may have different resistance characteristics before and after the current flows.

In FIG. 10, (iii) shows a current-voltage characteristic of the variable resistance layer 523 according to the applied current. The electric current applied to the selected memory cell 720 may be determined by the compensation memory cell 710, that is, a voltage at the gate 531 of the compensation memory cell 710. In addition, the variable resistance layer 523 of the selected memory cell 720 may have resistance state of various levels according to the magnitude of the applied current. That is, the variable resistance layer 523 may have the resistance characteristic that varies depending on the magnitude of the applied current. Thus, more information may be recorded on one memory cell MC.

Figure 11:
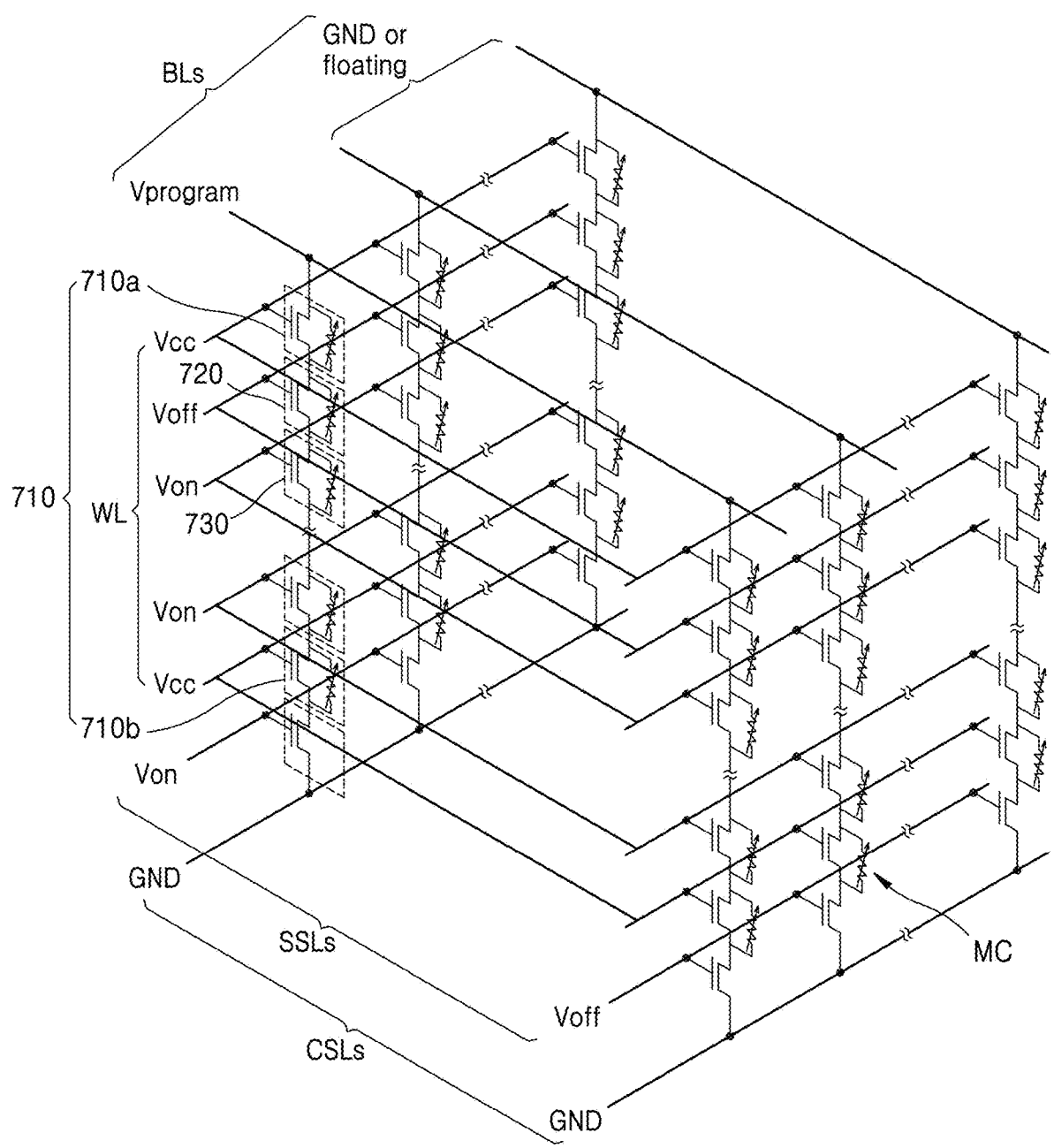
FIG. 11 is a diagram of an equivalent circuit in a programming mode of a memory block according to another embodiment.

FIG. 11 is a diagram of an equivalent circuit in a programming mode of a memory block according to another embodiment. When FIG. 7 and FIG. 11 are compared with each other, in FIG. 7, one cell string includes one compensation memory cell 710, whereas in FIG. 11, one cell string includes a plurality of compensation memory cells 710, e.g., first and second compensation memory cells 710a and 710b. FIG. 11 shows two compensation memory cells 710a and 710b, but one or more embodiments are not limited thereto. That is, three or more compensation memory cells may be provided.

The plurality of first and second compensation memory cells, for example first and second compensation memory cells 710a and 710b are connected to the selected memory cell 720 in series, and a magnitude of the electric current flowing on each of the first and second compensation memory cells 710a and 710b may be determined according to the compensation voltage Vcc applied to each of the first and second compensation memory cells 710a and 710b. A magnitude of the electric current applied to the selected memory cell 720 may be determined according to a minimum magnitude of the electric current flowing on the plurality of compensation memory cells, for example, the first and second compensation memory cells 710a and 710b. The dropped programming voltage Vprogram' applied to the selected memory cell 720 connected to the plurality of compensation memory cells 710a and 710b is much lower than that applied to the selected memory cell 720 connected to one compensation memory cell.

The compensation memory cell 710 may include a transistor and a variable resistance layer like in the selected memory cell 720 and the non-selected memory cell 730. However, one or more embodiments are not limited thereto. In some embodiments, the variable resistance layer may be omitted and/or not included in the compensation memory cell 710.

Figure 12:
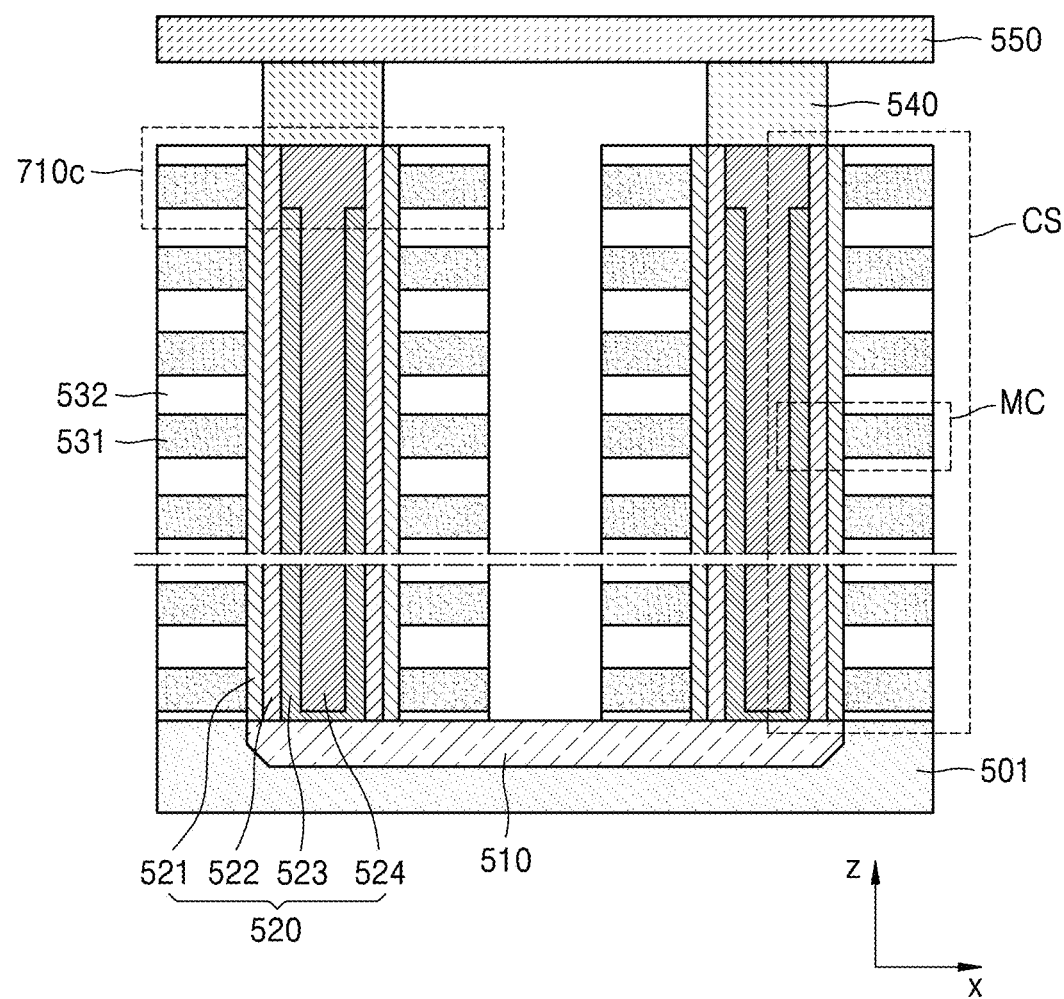
FIG. 12 is a diagram of a memory block including a compensation memory cell having no resistance variable layer according to another embodiment.

FIG. 12 is a diagram of a memory block including the compensation memory cell 710 that does not include the variable resistance layer 523, according to another embodiment. As shown in FIG. 12, a compensation memory cell 710c is at an uppermost portion of the memory block. The compensation memory cell 710c may include the gates 531, the gate insulating layer 521, and the semiconductor layer 522. The semiconductor layer 522 of the compensation memory cell 710a is directly connected to a drain electrode 540 and may be connected to a source electrode 510 via the semiconductor layers 522 of a plurality of memory cells MC. In FIG. 12, the compensation memory cell 710c is at the uppermost portion of the memory block, but one or more embodiments are not limited thereto. The compensation memory cell 710c may be arranged at a lowermost portion of the memory block or at a middle portion of the memory cells MC.

Figure 13:
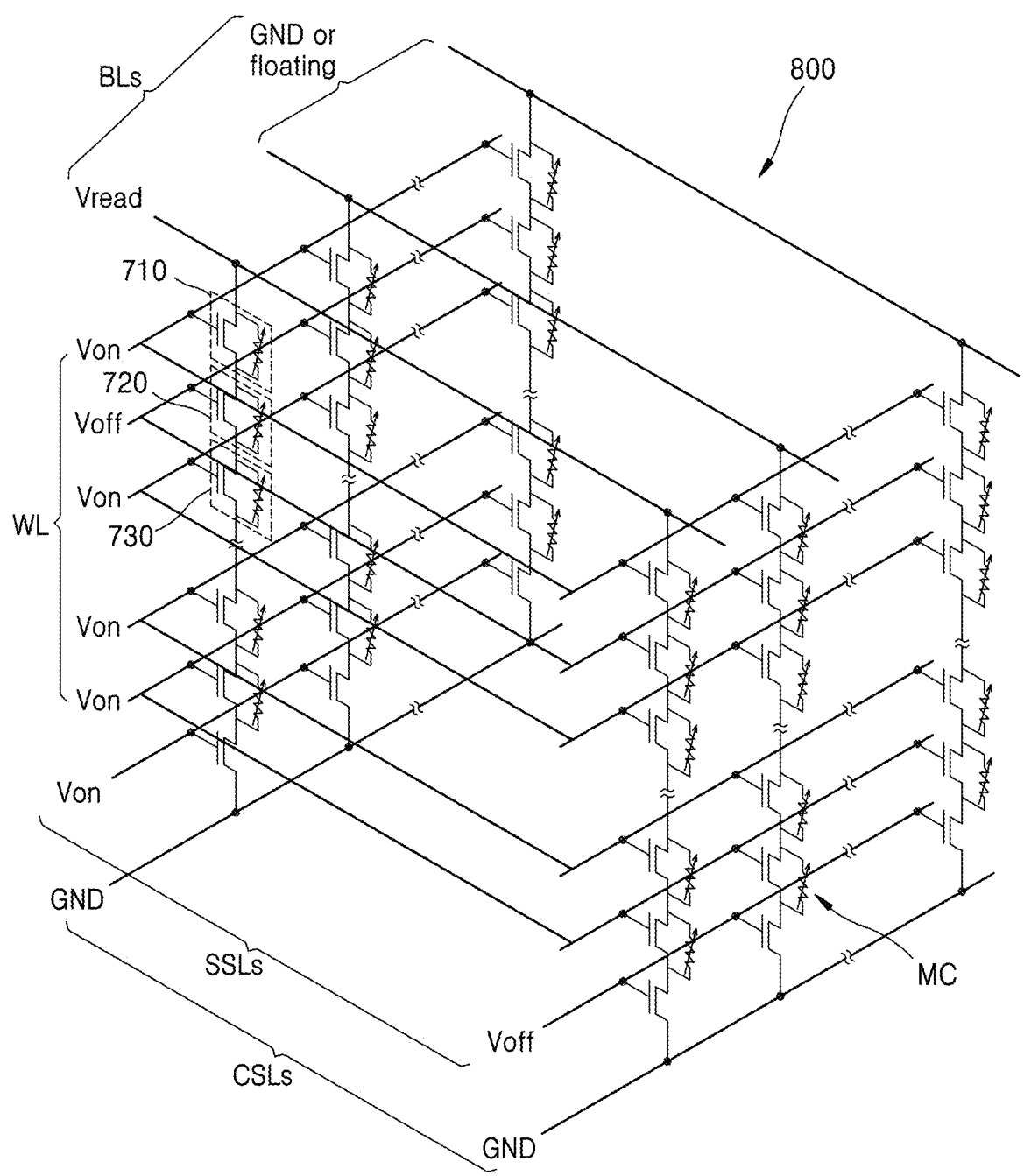
FIG. 13 is a diagram of an equivalent circuit of a memory block in a reading mode according to an embodiment.

FIG. 13 is a diagram of an equivalent circuit of a memory block 800 in a reading mode according to an embodiment. Referring to FIG. 13, each of the plurality of memory cells MC in the memory block 800 may include the gates 531, the gate insulating layer 521, the semiconductor layer 522, and the variable resistance layer 523 shown in FIG. 5.

The memory cells MC in the memory block 800 may include the compensation memory cell 710, the selected memory cell 720, and the non-selected memory cell 730. A reading mode of the non-volatile memory device denotes a mode in which a reading operation is performed on the memory block and the selected memory cell 720 may denote the memory cell MC that is a target on which the reading operation is performed.

During the reading mode, the control logic 250 may apply the turn-on voltage Von to the string selection line SSL connected to the selected memory cell 720 and may apply the turn-off voltage Voff to the string selection line that is not connected to the selected memory cell 720, from among the plurality of string selection lines SSL. In addition, the control logic 250 may apply the turn-on voltage Von to the word line WL, from among the plurality of word lines WL, connected to the compensation memory cell 710 and the non-selected memory cell 730 and may apply the turn-off voltage Voff to the word line WL connected to the selected memory cell 720.

Here, the turn-on voltage Von has a magnitude that may turn on the transistor, e.g., allow the electric current to flow only on the semiconductor layer 522 of the transistor. The turn-off voltage Voff has a magnitude that may turn off the transistor, e.g., block the electric current from flowing on the semiconductor layer 522 of the transistor. Values of the turn-on voltage Von and the turn-off voltage Voff may vary depending on the kinds, thickness, etc. of the materials included in the gates 531, the gate insulating layer 521, the semiconductor layer 522, and the variable resistance layer 523 in the plurality of memory cells MC. An absolute value of the turn-on voltage Von is generally greater than an absolute value of the turn-off voltage Voff.

In addition, from among the plurality of bit lines BL, a reading voltage Vread is applied to the bit line BL connected to the selected memory cell 720 to perform the reading operation on the selected memory cell 720. The reading voltage Vread may be provided from outside, e.g., the memory controller 100, via the input/output circuit 240. The reading voltage Vread may be a voltage for reading data recorded on the selected memory cell 720. From among the plurality of bit lines BL, the bit lines BL that are not connected to the selected memory cell 720 may be grounded or floated. As such, the reading operation may be performed on the selected memory cell 720.

Figure 14:
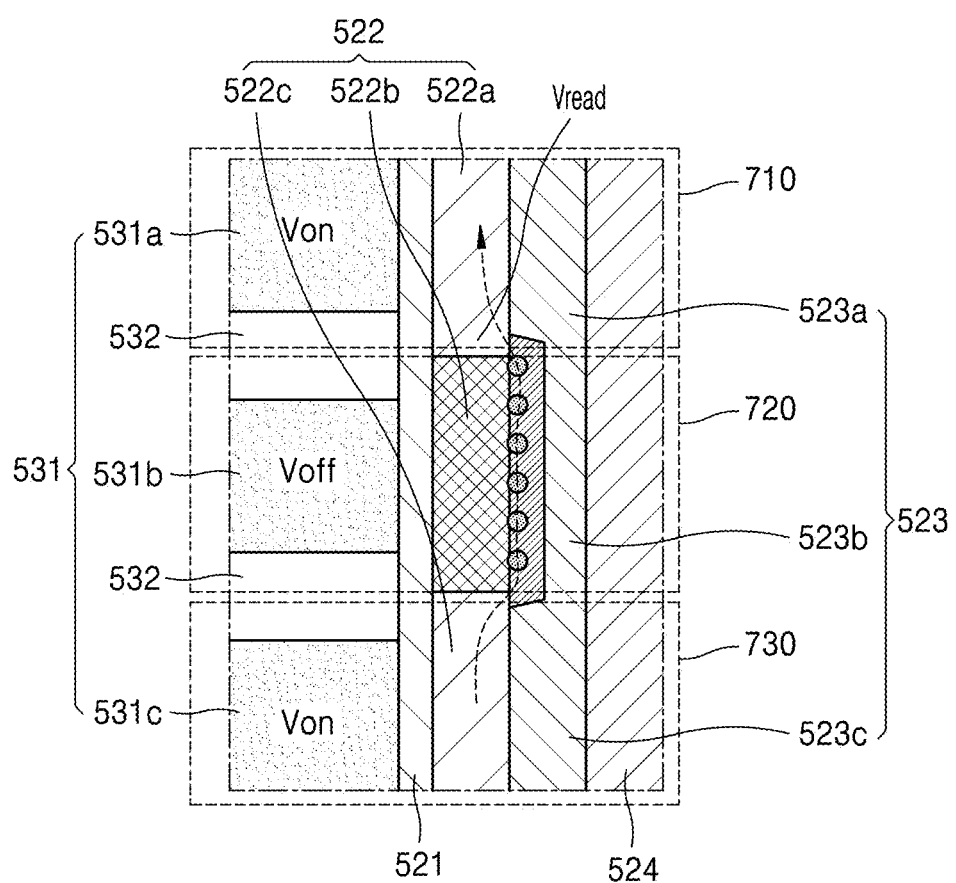
FIG. 14 is a diagram regarding a current movement in a selected memory cell in the reading mode of FIG. 13.

FIG. 14 is a diagram regarding a current movement in the selected memory cell 720 in the reading mode of FIG. 13.

In the reading mode, the reading voltage Vread is applied to the bit line BL connected to the selected memory cell 720 and the turn-on voltage Von is applied to the compensation memory cell 710 and the non-selected memory cell 730, and thus a semiconductor layer 522*a* in the compensation memory cell 710 and a semiconductor layer 522*c* in the non-selected memory cell 730 have a conductive property. Thus, a reading current Iread flows through the semiconductor layer 522*a* of the compensation memory cell 710 and the semiconductor layer 522*c* of the non-selected memory cell 730. However, since the turn-off voltage Voff is applied to the selected memory cell 720, the reading current Iread only flows on the variable resistance layer 523*b* of the selected memory cell 720 and the reading operation may be performed on the selected memory cell 720.

A resistance state of the variable resistance layer 523 generally has a distribution in a log scale (dynamic range). Thus, a ratio of a maximum resistance with respect to a minimum resistance of the variable resistance layer 523 may be large and a deviation may be also large. The variation in the resistance of the variable resistance layer 523 may exceed a limit of a dynamic range of a sense amplifier that senses the resistance. Thus, it may be difficult to bond the sense amplifier to the memory cell MC or the memory device.

Figure 15:
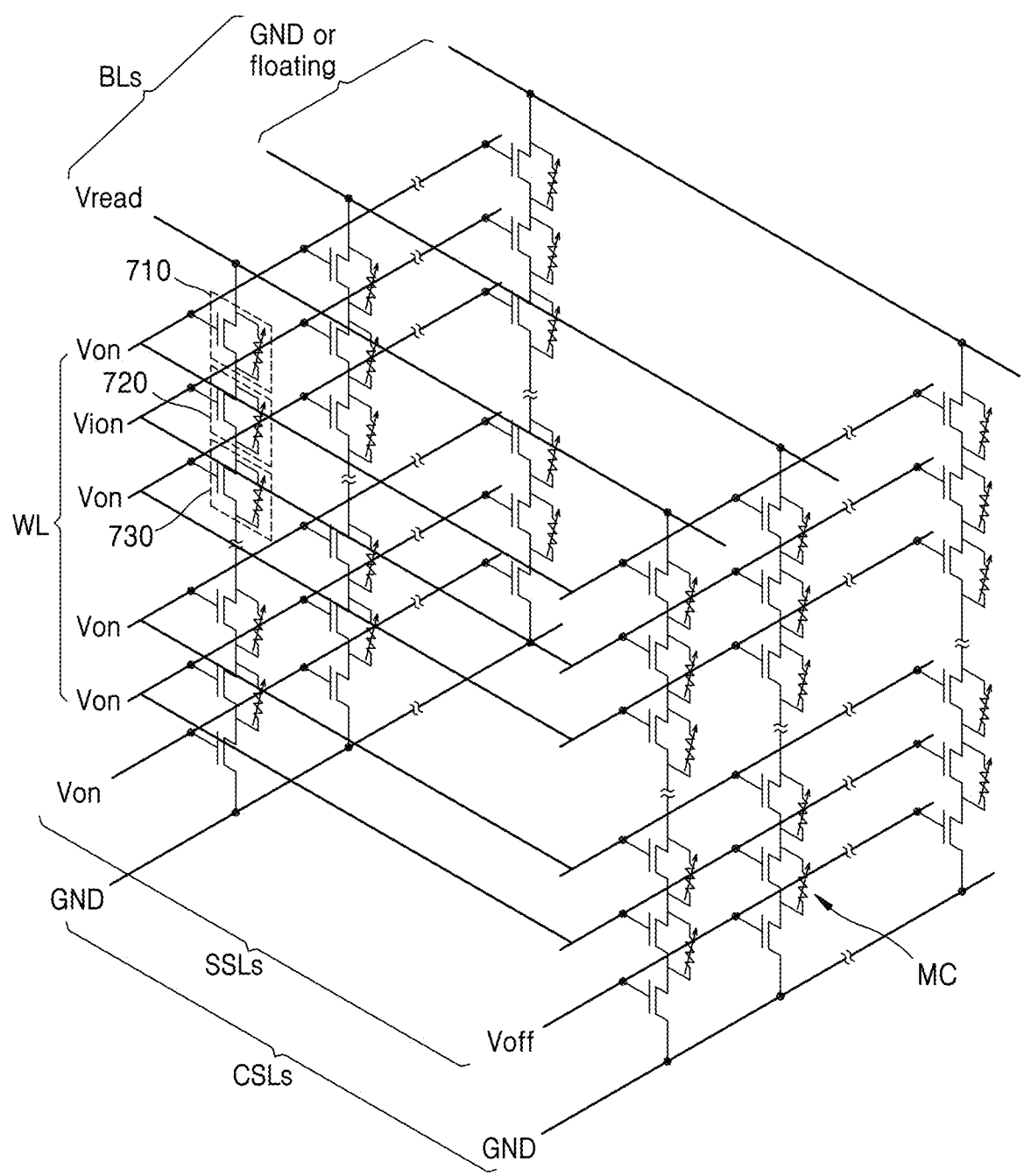
FIG. 15 is a diagram showing a circuit during a reading mode of a memory block according to another embodiment.

FIG. 15 is a diagram showing a circuit during a reading mode of a memory block according to another embodiment. Referring to FIGS. 2, 6A, and 15, during the reading mode, the control logic 250 may apply the turn-on voltage Von to the string selection line SSL connected to the selected memory cell 720 and may apply the turn-off voltage Voff to the string selection line that is not connected to the selected memory cell 720, from among the plurality of string selection lines SSL. In addition, the control logic 250 may apply the turn-on voltage Von to the word line WL, from among the plurality of word lines WL, connected to the compensation memory cell 710 and the non-selected memory cell 730.

The control logic 250 may apply a current-on voltage Vion to the word line WL connected to the selected memory cell 720. The current-on voltage Vion may have a magnitude that may allow the electric current to flow on both the semiconductor layer 522 and the variable resistance layer 523 of the transistor included in the selected memory cell 720. An absolute value of the current-on voltage Vion may be greater than that of the turn-off voltage Voff and less than that of the turn-on voltage Von. The value of the current-on voltage Vion may vary depending on the kinds, thickness, etc. of the materials included in the gates 531, the gate insulating layer 521, the semiconductor layer 522, and the variable resistance layer 523 in the plurality of memory cells MC. In particular, the current-on voltage Vion may allow a resistance distribution of the selected memory cell 720 to have a linear scale.

In addition, the reading voltage Vread may be applied to a bit line BL connected to the selected memory cell 720, from among the plurality of bit lines BL. The reading voltage Vread may be provided from outside, e.g., the memory controller 100 (see FIG. 1), via the input/output circuit 240. From among the plurality of bit lines BL, the bit lines BL that are not connected to the selected memory cell 720 may be grounded or floated. As such, the reading operation may be performed on the selected memory cell 720.

Figure 16:
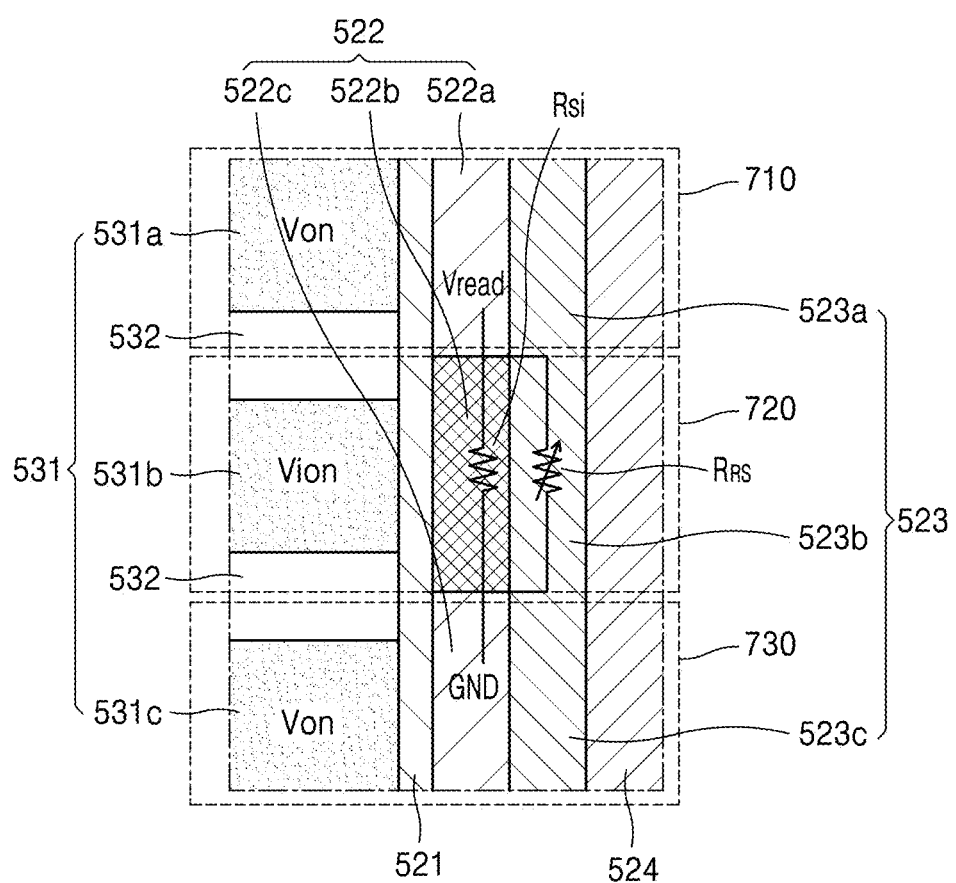
FIG. 16 is a diagram regarding a current movement in a selected memory cell during the reading mode of FIG. 15.

FIG. 16 is a diagram regarding a current movement in the selected memory cell 720 during the reading mode of FIG. 15.

In the reading mode, the reading voltage Vread is applied to the bit line BL connected to the selected memory cell 720 and the turn-on voltage Von is applied to the non-selected memory cell 730, and thus the semiconductor layer 522*c* in the non-selected memory cell 730 have a conductive property. Therefore, the reading current Iread flows through the semiconductor layer 522*c* of the non-selected memory cell 730. However, since the current-on voltage Vion is applied to the selected memory cell 720, the reading current Iread flows on both the semiconductor layer 522*b* and the variable resistance layer 523*b* of the selected memory cell 720.

The current-on voltage Vion may have a magnitude that allows the resistance of the semiconductor layer 522*b* of the selected memory cell 720 to be in a similar range to that of the variable resistance layer 523*b* of the selected memory cell 720. By the magnitude of the current-on voltage Vion, the resistance of the semiconductor layer 522*b* of the selected memory cell 720 is equal to or greater than a minimum resistance of the variable resistance layer 523*b* of the selected memory cell 720 or equal to or less than a maximum resistance of the variable resistance layer 523*c* of the selected memory cell 720. Alternatively, when the resistance of the variable resistance layer 523*b* ranges from $10^4$ $\Omega m^{-1}$ to $10^{12}$ $\Omega m^{-1}$, the magnitude of the current-on voltage Vion may be in a range, in which the resistance of the semiconductor layer 522*b* also ranges from $10^4$ $\Omega m^{-1}$ to $10^{12}$ $\Omega m^{-1}$. Alternatively, the magnitude of the current-on voltage Vion may allow a ratio of a maximum value with respect to a minimum value of a combined resistance of the semiconductor layer 522*b* and the variable resistance layer 523*b* in the selected memory cell 720 to be 10 or less. Thus, the total resistance of the selected memory cell 720 may be determined as a parallel resistance of the semiconductor layer 522*b* and the variable resistance layer 523*b*.

Since the total resistance of the selected memory cell 720 is determined as the resistance of the semiconductor layer 522*b* and the variable resistance layer 523*b* connected in parallel, the total resistance of the selected memory cell 720 may have a linear scale distribution even when the resistance state of the variable resistance layer 523*b* is in the log scale. Therefore, uniformity of the resistance state with respect to the memory cells MC may be improved and a current within a certain range may be output from the selected memory cell 720, and thus the bonding property with respect to the sense amplifier that senses the selected memory cell 720 may be improved.

According to the disclosure, the resistance states of various levels may be generated on the selected memory cell by controlling the magnitude of the current flowing on the selected memory cell. Since the memory cell may have the resistance states of various levels, more information may be stored on the memory cell. In the reading mode, by applying the voltage within a range, in which the semiconductor layer, as well as the variable resistance layer, may become a resistance, to the memory cell of the non-volatile memory device, the resistance value of the memory cell may be distributed in the linear scale range. This may improve the uniformity of the current output from the non-volatile memory device. In addition, it may be easy to bond to the sense amplifier that detects the electric current of the non-volatile memory device.

The above description of the disclosure is provided for the purpose of illustration, and it would be understood by those skilled in the art that various changes and modifications may be made without changing technical conception and essential features of the disclosure. Thus, the embodiments of the disclosure set forth herein or shown above are to be interpreted in an illustrative and non-limiting sense. For example, each component described to be of a single type can be implanted in a distributed manner. Likewise, components described to be distributed can be implanted in a combined manner.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A non-volatile memory device comprising:
   a memory cell array having a vertically stacked structure, the memory cell array including a semiconductor layer and a variable resistance layer, the memory cell array including a plurality of memory cells that each include a corresponding portion of the semiconductor layer and a corresponding portion of the variable resistance layer, and the plurality of memory cells including a non-selected memory cell, a compensation memory cell, and a selected memory cell;
   a bit line configured to apply a programming voltage to the memory cell array; and
   a control logic configured to apply an adjusted program voltage to the selected memory cell, the adjusted program voltage being dropped compared to the programming voltage due to the compensation memory cell, based on applying a first voltage to the compensation memory cell, a second voltage to the selected memory cell, and a third voltage to the non-selected memory cell,
   the first voltage allowing an electric current of a certain magnitude to flow to the compensation memory cell,
   the second voltage allowing the electric current to flow only to the corresponding portion of the variable resistance layer of the selected memory cell, and
   the third voltage allowing the electric current to flow only to the semiconductor layer of the non-selected memory cell.

2. The non-volatile memory device of claim 1, wherein an absolute value of the first voltage is greater than an absolute value of the second voltage.

3. The non-volatile memory device of claim 1, wherein an absolute value of the first voltage is less than an absolute value of the third voltage.

4. The non-volatile memory device of claim 1, wherein a magnitude of the first voltage allows a resistance of the corresponding portion of the semiconductor layer in the compensation memory cell to be less than a resistance of the corresponding portion of the variable resistance layer in the compensation memory cell.

5. The non-volatile memory device of claim 1, wherein a resistance of the corresponding portion of the semiconductor layer in the compensation memory cell is less than or equal to $1/10$ of a resistance of the corresponding portion of the variable resistance layer in the compensation memory cell.

6. The non-volatile memory device of claim 1, wherein a magnitude of the first voltage allows a resistance of the corresponding portion of the semiconductor layer in the compensation memory cell to be within a range of $10^5$ $\Omega m^{-1}$ to $10^7$ $\Omega m^{-1}$, based on the control logic applying the first voltage to the compensation memory cell.

7. The non-volatile memory device of claim 1, wherein a magnitude of the first voltage allows a resistance of the corresponding portion of the variable resistance layer in the compensation memory cell to be within a range of $10^8$ $\Omega m^{-1}$ to $10^{11}$ $\Omega m^{-1}$, based on the control logic applying the first voltage to the compensation memory cell.

8. The non-volatile memory device of claim 1, wherein the compensation memory cell and the selected memory cell are connected to each other in series.

9. The non-volatile memory device of claim 1, wherein the control logic is configured to make the electric current of the certain magnitude flow to the corresponding portion of the variable resistance layer in the selected memory cell during a program operation.

10. The non-volatile memory device of claim 1, wherein the corresponding portion of the semiconductor layer in the compensation memory cell and the corresponding portion of the variable resistance layer in the compensation memory cell are connected to each other in parallel.

11. The non-volatile memory device of claim 1, wherein the memory cell array includes:
    the semiconductor layer extending in a first direction;
    a plurality of gates and a plurality of insulators extending in a second direction perpendicular to the first direction, the plurality of gates and the plurality of insulators being alternately arranged;
    a gate insulating layer extending in the first direction among the plurality of gates, the plurality of insulators, and the semiconductor layer; and
    the variable resistance layer extending in the first direction on the semiconductor layer.

12. The non-volatile memory device of claim 11, wherein the variable resistance layer is in contact with the semiconductor layer.

13. The non-volatile memory device of claim 11, wherein the variable resistance layer is spaced apart from the gate insulating layer with the semiconductor layer therebetween.

14. The non-volatile memory device of claim 1, wherein the variable resistance layer has a hysteresis characteristic.

15. The non-volatile memory device of claim 1, wherein the variable resistance layer includes a transition metal oxide, a transition metal nitride, or both the transition metal oxide and the transition metal nitride.

16. The non-volatile memory device of claim 1, wherein the compensation memory cell is a first compensation memory cell,
    the plurality of memory cells further include a second compensation memory cell, and
    the first compensation memory cell and the second compensation memory cell that are each connected to the selected memory cell in series.

17. An operating method of a non-volatile memory device including a memory cell array having a vertically stacked structure, the memory cell array including a semiconductor layer and a variable resistance layer, the memory cell array including a plurality of memory cells that each include a corresponding portion of the semiconductor layer and a corresponding portion of the variable resistance layer, the method comprising:

applying a first voltage to a compensation memory cell among the plurality of memory cells, the first voltage allowing an electric current of a certain magnitude to flow to the corresponding portion of the compensation memory cell in the memory cell array;

applying a second voltage to a selected memory cell among the plurality of memory cells, the second voltage allowing the electric current to flow only to the corresponding portion of the variable resistance layer in the selected memory cell of the memory cell array;

applying a third voltage to a non-selected memory cell among the plurality of memory cells, the third voltage allowing the electric current to flow only to the semiconductor layer of the non-selected memory cell of the memory cell array; and applying a programming voltage, which has dropped due to the compensation memory cell, to the selected memory cell of the memory cell array.

18. The operating method of claim 17, wherein an absolute value of the first voltage is greater than an absolute value of the second voltage.

19. The operating method of claim 17, wherein an absolute value of the first voltage is less than an absolute value of the third voltage.

20. The operating method of claim 17, wherein a magnitude of the first voltage allows a resistance of the corresponding portion of the semiconductor layer in the compensation memory cell to be less than a resistance of the corresponding portion of the variable resistance layer in the compensation memory cell.

21. The operating method of claim 17, wherein a resistance of the corresponding portion of the semiconductor layer in the compensation memory cell is less than or equal to 1/10 of the resistance of corresponding portion of the variable resistance layer in the compensation memory cell.

22. The operating method of claim 17, wherein a magnitude of the first voltage allows a resistance of the corresponding portion of the semiconductor layer in the compensation memory cell to be within a range of $10^5$ $\Omega m^{-1}$ to $10^7$ $\Omega m^{-1}$.

23. The operating method of claim 17, wherein the compensation memory cell and the selected memory cell are connected to each other in series.

24. The operating method of claim 17, wherein the corresponding portion of the semiconductor layer and the corresponding portion of the variable resistance layer in the compensation memory cell are connected to each other in parallel.

25. A non-volatile memory device comprising:

a substrate;

a cell string on the substrate,
the cell string including a plurality of memory cells stacked on top of each other, a semiconductor layer, and a resistance change layer,
each memory cell, of the plurality of memory cells in the cell string, including a corresponding portion of the semiconductor layer connected to a corresponding portion of a variable resistance layer,
the plurality of memory cells including a non-selected memory cell, a compensation memory cell, and a selected memory cell;

a bit line connected to the cell string, the bit line configured to apply a programing voltage to the cell string during a program operation;

a plurality of word lines on the substrate, the plurality of word lines including a non-selected word line connected to the corresponding portion of the semiconductor layer of the non-selected memory cell, a compensation word line connected to the corresponding portion of the semiconductor layer of the compensation memory cell, and a selected word line connected to the corresponding portion of the semiconductor layer of the selected memory cell; and a control logic, during the program operation, being configured to apply an adjusted program voltage to the selected memory cell, based on applying a turn-on voltage to the non-selected word line, applying a turn-off voltage to the selected word line, and applying a compensation voltage to the compensation word line,
a magnitude of the adjusted program voltage being less than a magnitude of the programming voltage, and
a magnitude of the compensation voltage being between a magnitude of the turn-on voltage and a magnitude of the turn-off voltage.

* * * * *